(12) United States Patent
Kurokawa

(10) Patent No.: US 7,456,660 B2
(45) Date of Patent: Nov. 25, 2008

(54) SEMICONDUCTOR DEVICE AND DISPLAY DEVICE

(75) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 913 days.

(21) Appl. No.: 10/965,894

(22) Filed: Oct. 18, 2004

(65) Prior Publication Data

US 2005/0138507 A1    Jun. 23, 2005

(30) Foreign Application Priority Data

Oct. 31, 2003   (JP)   ............... 2003-373775

(51) Int. Cl.
*H03K 19/00*   (2006.01)
*G09G 3/36*    (2006.01)

(52) U.S. Cl. .............. 326/114; 326/104; 326/108; 716/17; 716/5; 345/92; 345/104

(58) Field of Classification Search .............. 326/104, 326/108, 112, 114; 716/17, 5; 345/92, 104
See application file for complete search history.

(56) References Cited

U.S. PATENT DOCUMENTS

| 5,369,603 | A |   | 11/1994 | Myers |
|-----------|---|---|---------|-------|
| 5,649,064 | A |   | 7/1997  | Jorgensen et al. |
| 5,796,129 | A | * | 8/1998  | Mizuno ............ 257/206 |
| 5,929,469 | A |   | 7/1999  | Mimoto et al. |
| 6,219,630 | B1|   | 4/2001  | Yonezawa et al. |
| 6,538,632 | B1| * | 3/2003  | Yamazaki et al. ............ 345/98 |
| 6,549,184 | B1|   | 4/2003  | Koyama et al. |
| 6,735,558 | B1|   | 5/2004  | Yamaguchi |
| 6,756,816 | B2| * | 6/2004  | Miyake ............ 326/83 |
| 6,765,549 | B1|   | 7/2004  | Yamazaki et al. |
| 6,795,800 | B1|   | 9/2004  | Lee |
| 6,798,148 | B2|   | 9/2004  | Inukai |
| 6,798,394 | B1|   | 9/2004  | Chimura |

(Continued)

FOREIGN PATENT DOCUMENTS

JP           06-085064           3/1994

(Continued)

*Primary Examiner*—Vibol Tan
(74) *Attorney, Agent, or Firm*—Fish & Richardson P.C.

(57) ABSTRACT

The invention provides a low cost and high performance functional circuit by reducing time required for the repetition of logic synthesis and routing of layout in a functional circuit design. A standard cell used for the logic synthesis and the routing of layout is configured by a logic circuit on an output side and a logic circuit on an input side and a driving capacity of the logic circuit on the output side is made large while gate input capacitance of the logic circuit on the input side is made small. By forming the standard cell in this manner, a ratio that the gate delay occupies in the delay time of a functional circuit can be relatively increased. Therefore, even when wiring capacitance after the routing of layout is not estimated at high precision in advance, an operating frequency can be obtained at high precision in the logic synthesis as long as a gate delay of each standard cell can be estimated at high precision. That is, a reliability of the logic synthesis result is improved, therefore, the logic synthesis and an automatic routing of layout are not required to be repeated, which can shorten the design period.

64 Claims, 10 Drawing Sheets

U.S. PATENT DOCUMENTS

| | | |
|---|---|---|
| 6,857,112 B1 | 2/2005 | Teig et al. |
| 7,092,845 B2 | 8/2006 | Keane et al. |
| 7,199,618 B2 * | 4/2007 | Gliese et al. .................. 326/98 |
| 2001/0045571 A1 * | 11/2001 | Gandhi et al. ................ 257/202 |
| 2003/0071303 A1 * | 4/2003 | Yamazaki et al. ........... 257/315 |
| 2004/0078175 A1 | 4/2004 | Shaw et al. |
| 2005/0015235 A1 | 1/2005 | Maeda et al. |
| 2005/0104133 A1 * | 5/2005 | Kanno et al. ................. 257/371 |

FOREIGN PATENT DOCUMENTS

| | | |
|---|---|---|
| JP | 06-188312 | 7/1994 |
| JP | 06-209044 | 7/1994 |
| JP | 07-094586 | 4/1995 |
| JP | 08-029255 | 2/1996 |
| JP | 08-063515 | 3/1996 |
| JP | 08-110902 | 4/1996 |
| JP | 10-004141 | 1/1998 |
| JP | 2000-307007 | 11/2000 |
| JP | 2001-035930 | 2/2001 |
| JP | 2001-053154 | 2/2001 |
| JP | 2001-148333 | 5/2001 |
| WO | 2001/020429 | 3/2001 |

* cited by examiner

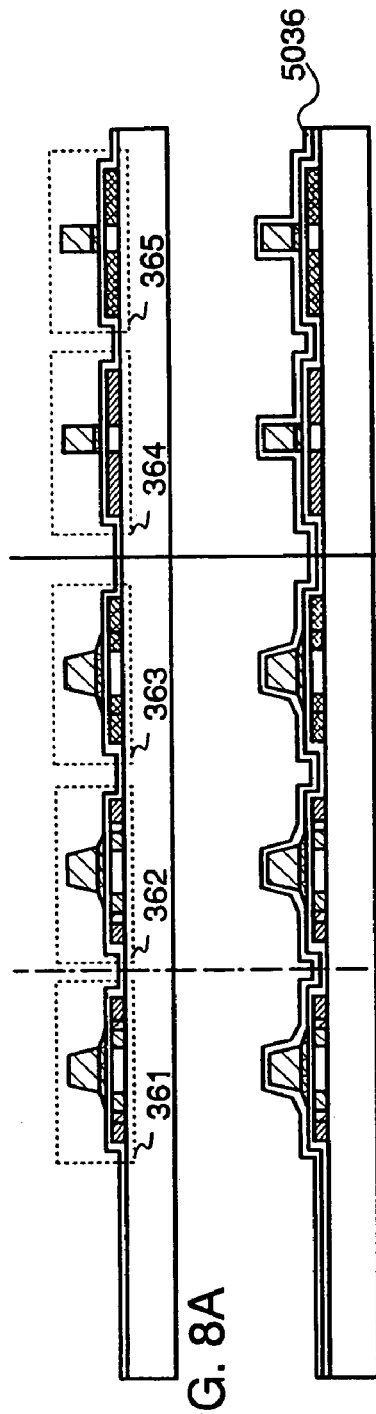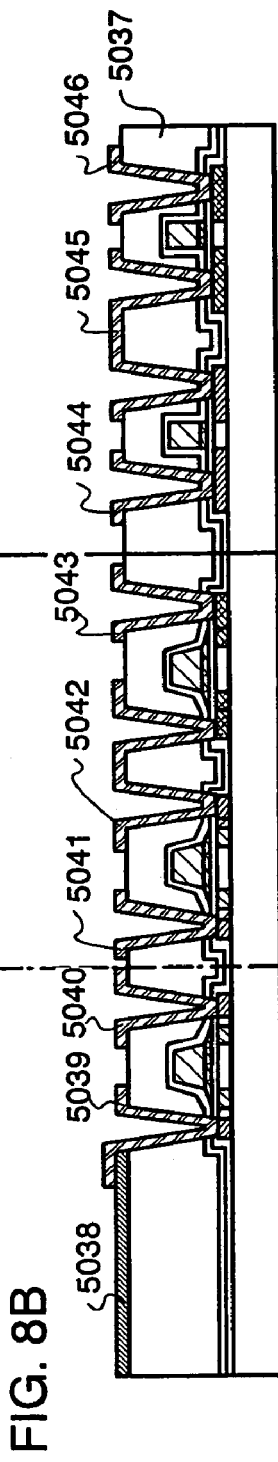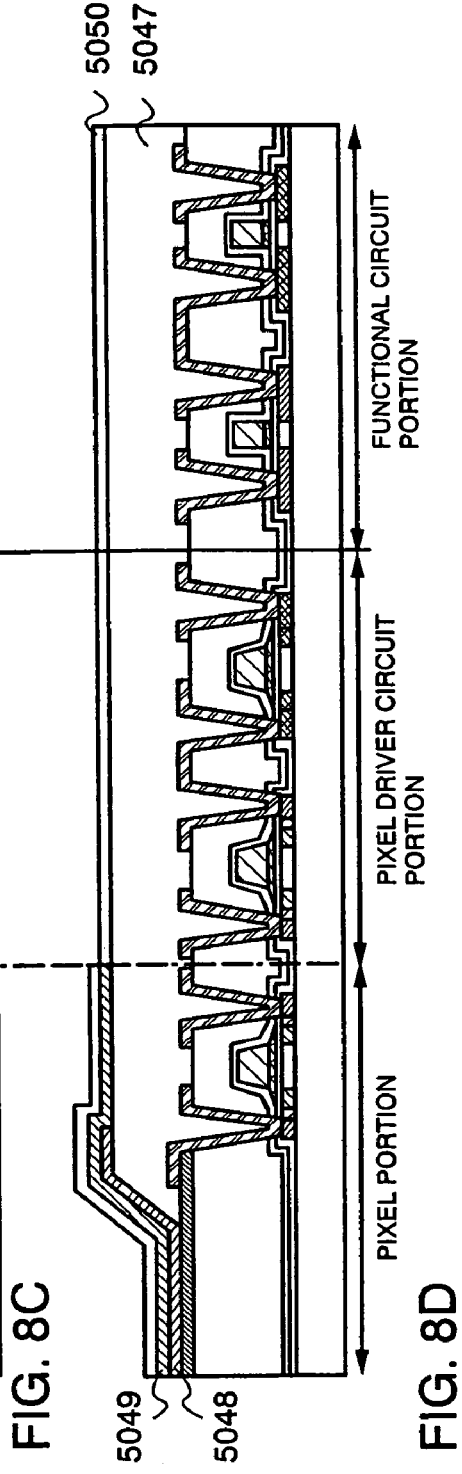
FIG. 8A  FIG. 8B  FIG. 8C  FIG. 8D

SEMICONDUCTOR DEVICE AND DISPLAY DEVICE

BACKGROUND OF THE INVENTION

1. Field of the Invention

The present invention relates to a semiconductor device having a functional circuit. In particular, the invention relates to a lightweight, thin, high-functional and low-cost semiconductor device. Further, the invention relates to a display device having a functional circuit on the same substrate, in particular to a lightweight, thin, high-functional and low-cost display device.

2. Description of the Related Art

In recent years, a technology development regarding a thin film transistor (hereinafter referred to as a TFT) using polycrystalline silicon thin film as an active layer has been rapidly advanced. For example, a display device having a pixel portion of which switching element is formed of a TFT and an active matrix display device having a circuit for driving a pixel, which is formed of a TFT are actively researched and developed. Such display devices have major advantages in low-cost, thin design, lightweight, high definition, low power consumption and the like.

Further, research and development for forming a functional circuit by a TFT and mounting it on the same substrate as a display device are advanced as a TFT becomes higher in function. A central processing unit (CPU), an image processing unit, a memory and the like are included in a functional circuit, which are required to be formed without spoiling the advantages of a display device using a TFT as described above.

SUMMARY OF THE INVENTION

These and other objects, features and advantages of the present invention will become more apparent upon reading of the following detailed description along with the accompanied drawings.

In designing a functional circuit, processes such as functional design, logic synthesis, automatic routing of layout (hereinafter referred to as routing of layout) are carried out as shown in FIG. 1, for example.

In the functional design, an operation of a functional circuit is described in hardware description language (hereinafter referred to as HDL). By performing a simulation appropriately, it is confirmed that an expected function of a functional circuit is obtained.

In the logic synthesis, the operation described in HDL that is described above is transposed to an actual electronic circuit by using a logic synthesis tool. The electronic circuit is obtained in a form which is generally referred to as a net list. The net list is a connection data of an input terminal or an output terminal of a standard cell included in the electronic circuit. It is to be noted that the standard cell is an electronic circuit element which is used when performing the logic synthesis and the routing of layout and has a predetermined function of a basic electronic circuit.

In the routing of layout, a photo mask is formed based on the net list. First, a standard cell included in the net list is disposed temporarily and an input terminal and an output terminal of each standard cell are connected sequentially according to the net list. By connecting all terminals, a photo mask is completed. The aforementioned series of operation is generally performed by using a tool for automatic routing of layout.

When performing the logic synthesis, electronic capacitance of each wiring is determined temporarily, the logic synthesis tool selects a standard cell having a driving capacity corresponding to the electronic capacitance, and a net list is optimized so as to satisfy a predetermined requirement such as an operating speed and power consumption.

The operating speed is estimated again by extracting electronic capacitance of each wiring after the routing of layout. In the case where a predetermined specification is not satisfied in this operation verification, the routing of layout or the logic synthesis is to be performed again. In the case of performing the logic synthesis again, an electronic capacitance after the routing of layout is to be used instead of the temporary electronic capacitance of each wiring. Provided that the predetermined requirement still cannot be obtained, these steps are to be repeated. The number of repetition being large, design period is increased and a functional circuit cannot be provided at low cost.

By estimating the temporary electronic capacitance larger in the first logic synthesis, a margin can be provided to electronic capacitance after the routing of layout. However, a circuit scale is increased as a buffer and the like are added which is originally unnecessary. Further, it is possible to increase a driving capacity by enlarging standard cells equally. However, input capacitance is increased as well as a circuit scale is increased, which ends in consuming more power.

The invention is made in view of the aforementioned problems and provides a low-cost and high performance functional circuit by reducing time required for the repetition of the logic synthesis and the routing of layout in designing a functional circuit. By using such a functional circuit, a low-cost and high-performance semiconductor device is provided. With such a functional circuit being mounted on the same substrate, a low-cost, thin, lightweight, high definition, and low power consumption display device can be provided.

There are standard cells which have a function that an output signal is determined when an input signal is determined, such as negation (hereinafter referred to as NOT), disjunction (OR), conjunction (AND), non-disjunction (NOR), non-conjunction (NAND), exclusive disjunction (XOR), exclusive non-disjunction (XNOR) relatively to an input signal. In this specification, these standard cells are referred to as gate cells, each of which is referred to as a NOT cell, an OR cell, an AND cell, a NOR cell, a NAND cell, an XOR cell, an XNOR cell and the like.

Further, there are also such standard cells as flip-flop (FF) and latch (LAT) that have a function to obtain an output according to a history of input signals. In this specification, these standard cells are referred to as sequential cells, each of which is referred to as an FF cell, a LAT cell and the like.

Generally, a standard cell is formed of a smaller circuit element having a function of a basic current circuit. In this specification, circuit elements having a function that an output signal is determined when an input signal is determined such as NOT, OR, AND, NOR, NAND, XOR, and XNOR are referred to as gate circuits, each of which is referred to as a NOT gate circuit, an OR gate circuit, an AND gate circuit, a NOR gate circuit, a NAND gate circuit, an XOR gate circuit, an XNOR gate circuit and the like. Similarly, such circuit elements as FF and LAT that have a function to output a different signal according to a history of operation are referred to as sequential circuits, each of which is referred to as an FF circuit and a LAT circuit. The gate circuits and the sequential circuits are referred to as logic circuits collectively.

A gate cell is formed of at least one gate circuit and is a standard cell excluding a sequential circuit. Moreover, the sequential cell is formed of at least one sequential circuit and is a standard cell excluding or including at least one gate circuit.

Such data as a function, circuit configuration, operating timing, output driving capacity, area, layout of each standard cell are registered in database which is referred to as a cell library. In the logic synthesis, data such as a function, operating timing and the like are utilized to generate a net list by selecting an optimal standard cell from the cell library appropriately so as to satisfy the given constraint, for example, an operating speed, area, power consumption and the like. Further, in the routing of layout, data of a layout and the like are utilized.

An operating speed of a functional circuit is in proportion to an inverse number of maximum delay time between FF cells. Here, the delay time is a summed value of a wiring delay and a gate delay of each standard cell included in a logic circuit between FF cells. Note that it is difficult to separate the gate delay and the wiring delay completely. However, for convenience in this specification, the gate delay is assumed to be a response time that takes from an input signal change to an output signal change in the case where the electronic capacitance connected to an output terminal of each standard cell is assumed to be zero. The wiring delay is a time which subtracted the gate delay from the response time that takes from an input signal change to an output signal change in the case where an appropriate current capacitor is assumed to be connected to an output terminal of each standard cell.

A gate delay of a standard cell can be estimated in details by simulation. On the other hand, the wiring delay is determined by an output driving capacity of the standard cell and electronic capacitance of a wiring connected to an output terminal. Therefore, without electronic capacitance of a wiring determined, a wiring delay is not determined either. Note that a delay time of an output signal change relatively to an input signal change in the case where an appropriate electronic capacitor is connected to an output terminal of a standard cell, that is, a sum of the gate delay time and the wiring delay is generally registered in the cell library as timing data of operation.

According to the invention, a standard cell used for the logic synthesis and the routing of layout is formed of a logic circuit on an input side and a logic circuit on an output side, thereby an output driving capacity of the logic circuit on the output side is increased and gate input capacitance of the logic circuit on the input side is decreased.

By forming the standard cell in this manner, a ratio that the gate delay in the standard cell occupies in the delay time of a functional circuit can be relatively increased. Therefore, even when wiring capacitance after routing of layout cannot be estimated accurately in advance, an operating frequency can be obtained at high precision in the logic synthesis by estimating the gate delay in each standard cell at high precision. That is, a reliability of the logic synthesis result is improved, therefore, the logic synthesis and an automatic routing of layout are not required to be repeated, which can shorten the design period.

As described above, a low-cost and high performance functional circuit can be provided. Further, by mounting such a functional circuit on the same substrate, a low-cost, thin, lightweight, high definition, and low power consumption display device can be provided.

The invention provides a semiconductor device comprising a functional circuit formed of a thin film transistor. The functional circuit is formed of at least one standard cell which is formed of a logic circuit on an input side and a logic circuit on an output side. Each of the logic circuit on the input side and the logic circuit on the output side is formed of at least one gate circuit or sequential circuit.

Moreover, the invention provides a semiconductor device comprising a functional circuit formed of a thin film transistor. The functional circuit is formed of at least one standard cell which is formed of a logic circuit on an input side and a logic circuit on an output side. Each of the logic circuit on the input side and the logic circuit on the output side is formed of a plurality of gate circuits or sequential circuits.

Moreover, the invention provides a semiconductor device comprising a functional circuit formed of a thin film transistor. The functional circuit is formed of a plurality of standard cells which are formed of logic circuits on an input side and logic circuits on an output side. Each of the logic circuits on the input side and the logic circuits on the output side is formed of at least one gate circuit or sequential circuit.

Moreover, the invention provides a semiconductor device comprising a functional circuit formed of a thin film transistor. The functional circuit is formed of a plurality of standard cells which are formed of logic circuits on an input side and logic circuits on an output side. Each of the logic circuits on the input side and the logic circuits on the output side is formed of a plurality of gate circuits or sequential circuits.

In the aforementioned configurations, the gate circuit may be any of a NOT gate circuit, an OR gate circuit, an AND gate circuit, a NOR gate circuit, a NAND gate circuit, an XOR gate circuit, and an XNOR gate circuit.

In the aforementioned configurations, the sequential circuit may be an FF circuit or a LAT circuit.

Moreover, in the aforementioned configurations, the logic circuit on the input side may be formed of at least one thin film transistor of which channel width is 10 µm or less.

Moreover, in the aforementioned configurations, the logic circuit on the output side may be formed of at least one thin film transistor of which channel width is 5 µm or more.

Moreover, in the aforementioned configurations, the functional circuit may be formed of at least one of a central processing unit, a memory device, a static memory, a dynamic memory, and a non-volatile memory.

Moreover, in the aforementioned configurations, the semiconductor thin film formed on a substrate having an insulating surface may be used as an active layer of the thin film transistor.

Moreover, in the aforementioned configurations, the substrate having the insulating surface may be any of a glass substrate, a quartz substrate, a plastic substrate, and an SOI substrate.

Moreover, the invention provides a display device comprising a functional circuit formed of a thin film transistor on the same substrate. The functional circuit is formed of at least one standard cell which is formed of a logic circuit on an input side and a logic circuit on an output side. Each of the logic circuit on the input side and the logic circuit on the output side is formed of at least one gate circuit or sequential circuit.

Moreover, the invention provides a display device comprising a functional circuit formed of a thin film transistor on the same substrate. The functional circuit is formed of at least one standard cell which is formed of a logic circuit on an input side and a logic circuit on an output side. Each of the logic circuit on the input side and the logic circuit on the output side is formed of at least one of a plurality of gate circuits or sequential circuits.

Moreover, the invention provides a display device comprising a functional circuit formed of a thin film transistor on the same substrate. The functional circuit is formed of a plurality of standard cells which are formed of a logic circuit on an input side and a logic circuit on an output side. Each of the logic circuit on the input side and the logic circuit on the output side is formed of at least one gate circuit or sequential circuit.

Moreover, the invention provides a display device comprising a functional circuit formed of a thin film transistor on the same substrate. The functional circuit is formed of a plurality of standard cells which are formed of a logic circuit on an input side and a logic circuit on an output side. Each of the logic circuit on the input side and the logic circuit on the output side is formed of at least one of a plurality of gate circuits or sequential circuits.

In the aforementioned configurations, the gate circuit may be any of a NOT gate circuit, an OR gate circuit, an AND gate circuit, a NOR gate circuit, a NAND gate circuit, an XOR gate circuit, and an XNOR gate circuit.

Moreover, in the aforementioned configurations, the sequential circuit may be an FF circuit or a LAT circuit.

Moreover, in the aforementioned configurations, the logic circuit on the input side may be formed of at least one thin film transistor of which channel width is 10 μm or less.

Moreover, in the aforementioned configurations, the logic circuit on the output side may be formed of at least one thin film transistor of which channel width is 5 μm or more.

Moreover, in the aforementioned configurations, the functional circuit may be formed of at least one of a central processing unit, a memory device, a static memory, a dynamic memory, and a non-volatile memory.

Moreover, in the aforementioned configurations, the semiconductor thin film formed on a substrate having an insulating surface may be used as an active layer of the thin film transistor of the thin film transistor.

Moreover, in the aforementioned configurations, the substrate having the insulating surface may be any of a glass substrate, a quartz substrate, a plastic substrate, and an SOI substrate.

Moreover, in the aforementioned configurations, the display device may be a liquid crystal display device.

Moreover, in the aforementioned configurations, the display device may be a display device using a self-light emitting element.

Moreover, it is effective to incorporate a semiconductor device or a display device having the aforementioned configurations in an electronic device.

According to the invention, it is possible to estimate an operating frequency at high precision even when wiring capacitance of an automatic routing of layout cannot be estimated at the time of logic synthesis. That is, a reliability of the logic synthesis result is improved, therefore, the logic synthesis and an automatic routing of layout are not required to be repeated, which can shorten the design period.

As described above, a semiconductor device having a low-cost and high performance functional circuit can be provided. Furthermore, by mounting such a functional circuit on the same substrate, a low-cost, thin, lightweight, high definition, and low power consumption display device can be provided.

BRIEF DESCRIPTION OF THE DRAWINGS

FIGS. 8A to 8D are diagrams showing a manufacturing method of an OLED display device of the invention.

DETAILED DESCRIPTION OF THE INVENTION

Embodiment Mode

In this embodiment mode, a standard cell which forms a functional circuit in a semiconductor device and a display device provided by the invention is described with reference to FIGS. 2A to 2D and 3A to 3D. Here, a NOR cell and a NAND cell are taken as examples of the standard cell.

Figure 1:
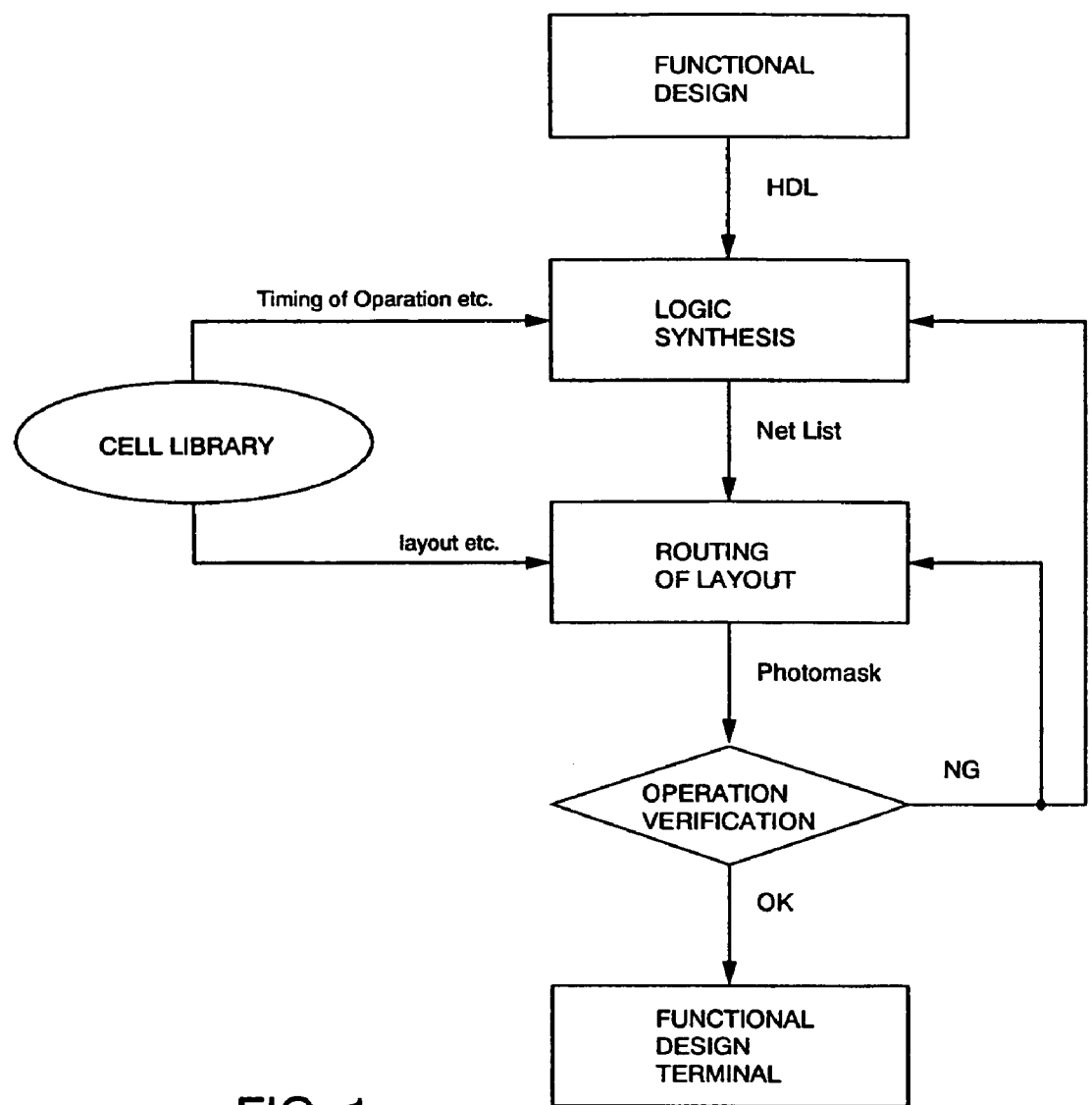
FIG. 1 is an example of design flow.
Figure 2A:
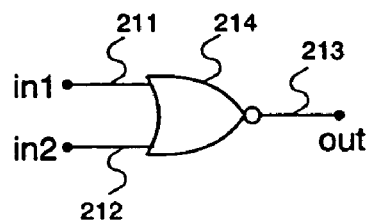
FIGS. 2A to 2D are circuit examples in a circuit signal level of standard cells of the invention.
Figure 2B:
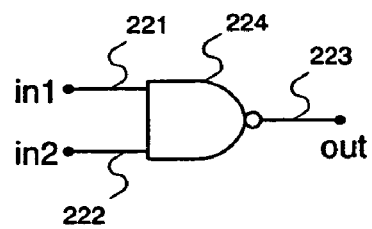

First, a circuit configuration without using the invention is described. FIGS. 2A and 2B show examples in which each of a NOR cell and a NAND cell is formed of one NOR gate circuit and one NAND gate circuit. Here, the NOR cell has input terminals 211 and 212, an output terminal 213, and a NOR gate circuit 214. Further, the NAND cell has input terminals 221 and 222, an output terminal 223, and a NAND gate circuit 224.

Figure 3A:
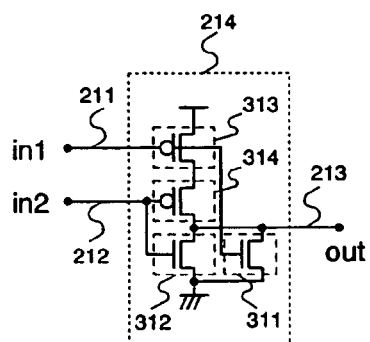
FIGS. 3A to 3D are circuit examples in a TFT level of standard cells of the invention.
Figure 3C:
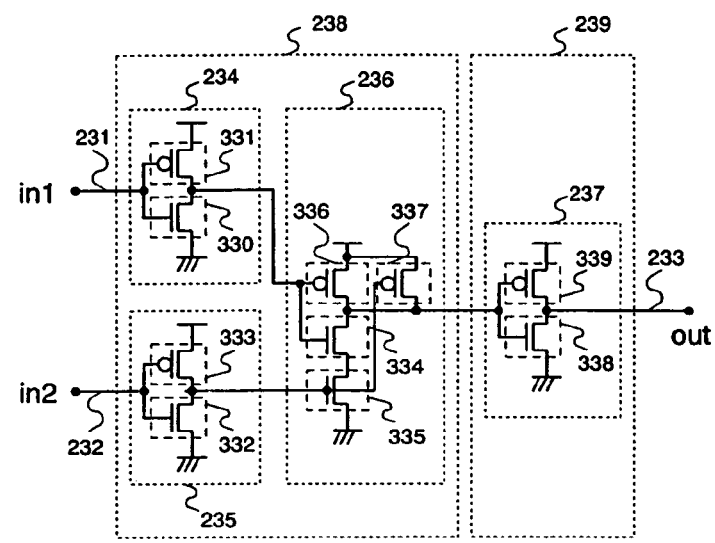
Figure 3B:
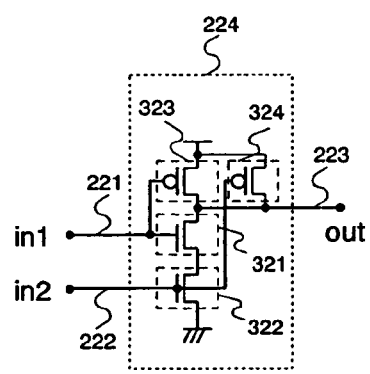

Furthermore, FIGS. 3A and 3B show CMOS circuits each corresponding to FIGS. 2A and 2B which are formed of TFTs. Note that the same portions are denoted by the same numerals in FIGS. 2A and 2B and FIGS. 3A and 3B. Here, N-channel TFTs 311, 312, 321, and 322, and P-channel TFTs 313, 314, 323, and 324 are shown.

Figure 2C:
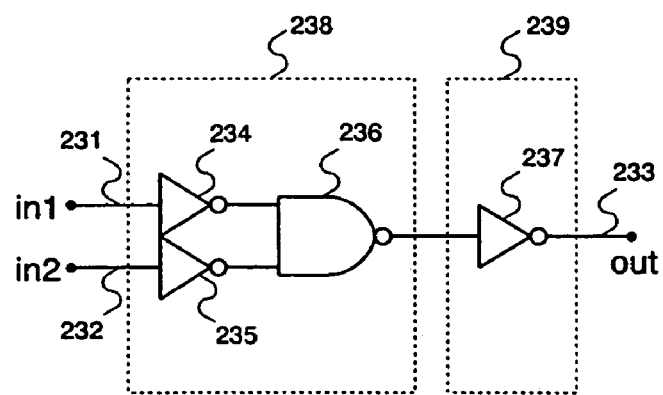
Figure 2D:
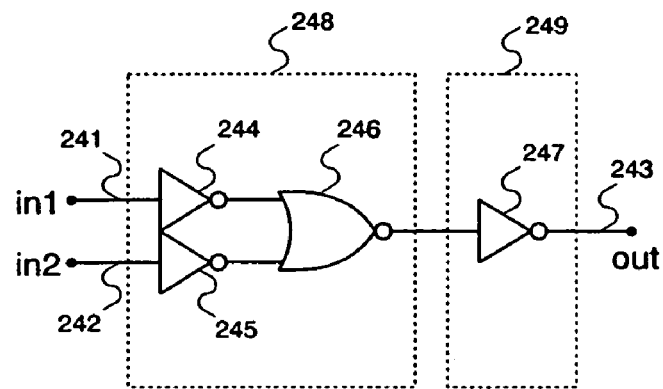

In this embodiment mode, on the other hand, a NOR cell and a NAND cell each has a circuit configuration shown in FIGS. 2C and 2D. Here, the NOR cell has input terminals 231 and 232, an output terminal 233, NOT gate circuits 234 and 235, a NAND gate circuit 236, and a NOT gate circuit 237. The NAND cell has input terminals 241 and 242, an output terminal 243, NOT gate circuits 244 and 245, a NOR gate circuit 246, and a NOT gate circuit 247.

Figure 3D:
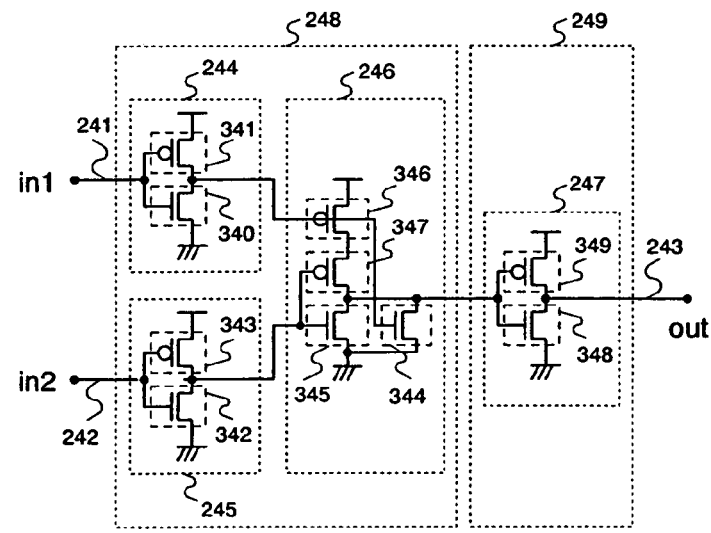

FIGS. 3C and 3D show CMOS circuits each corresponding to FIGS. 2C and 2D in TFT levels. Note that the same portions are denoted by the same numerals in FIGS. 2C and 2D, and FIGS. 3C and 3D. Here, N-channel TFTs 330, 332, 334, 335, 338, 340, 342, 344, 345, and 348, and P-channel TFTs 331, 333, 336, 337, 339, 341, 343, 346, 347, and 349 are shown.

In FIGS. 2C and 3C, a logic circuit 238 on an input side of the NOR cell is formed of the NOT gate circuits 234 and 235 and the NAND gate circuit 236. Further, a logic circuit 239 on an output side is formed of the NOT gate circuit 237. Similarly, in FIGS. 2D and 3D, a logic circuit 248 on an input side of the NAND cell is formed of the NOT gate circuits 244 and 245, and the NOR gate circuit 246. Further, a logic circuit 249 on an output side is formed of the NOT gate circuit 247.

In FIGS. 2C and 3C, the NOT gate circuit 237 of the logic circuit 239 on the output side has a larger driving capacity. Specifically, channel widths of the N-channel TFT 338 and the P-channel TFT 339 in FIG. 3C are increased. Similarly, in FIGS. 2D and 3D, the NOT gate circuit 247 of the logic circuit 249 on the output side has a larger driving capacity. Specifically, channel widths of the N-channel TFT 348 and the P-channel TFT 349 in FIG. 3D are increased. Here, it is preferable that the channel widths be long enough, considering a margin of wiring capacitance after automatic routing of layout relatively to a wiring capacitance model.

Furthermore, in FIGS. 2C and 3C, the NOT gate circuits 234 and 235 of the logic circuit 238 on the input side has less input capacitance. Specifically, channel widths of the N-channel TFTs 330 and 332, and the P-channel TFTs 331 and 333 are decreased. Similarly, in FIGS. 2D and 3D, the NOT gate circuits 244 and 245 of the logic circuit 248 on the input side has the input capacitance. Specifically, channel widths of the N-channel TFTs 340 and 342, and the P-channel TFTs 341 and 343 are decreased. Note that a channel width and a layout size of a TFT are optimized appropriately so that a layout area is decreased as well as a gate delay of a standard cell becomes as small as possible.

By forming the standard cell as described above, a ratio that a gate delay in the standard cell occupies in a delay time of a functional circuit can be relatively increased. The gate delay in the standard cell can be estimated at a high precision by simulation and is not influenced by the result of a routing of layout. The wiring delay, on the other hand, is influenced by the result of the routing of layout although the contribution of the wiring delay is relatively small. Therefore, even when the wiring capacitance after the routing of layout becomes larger than estimated first, it is expected that a difference between an operating speed after the routing of layout and an estimation at the time of logic synthesis becomes little.

In the case where merely a driving capacity of the standard cell is to be increased, a channel width of a TFT may be increased with a configuration as shown in FIGS. 3A and 3B. In this case, the total number of TFTs is far smaller as compared to the configurations of TFTs shown in FIGS. 3C and 3D. Furthermore, a gate delay in the standard cell can be decreased as well. Further, a ratio of gate delay in the delay time of a functional circuit is relatively increased, therefore, it is expected that a difference between an operating speed after a routing of layout and an estimation at the time of logic synthesis becomes small.

In view of a layout area and a low power consumption, however, it is highly probable that the circuit configuration of the invention is more advantageous. In the TFT configuration of FIG. 3A, for example, it is assumed that channel widths of the N-channel TFTs 311 and 312, and P-channel TFTs 313 and 314 be 10 µm, 10 µm, 40 µm, and 40 µm. In the case of realizing a similar driving capacity of output with the TFT configuration of FIG. 3C, on the other hand, channel widths of the N-channel TFT 338 and the P-channel TFT 339 may be 10 µm and 20 µm. Further, as for the other TFTs, for example, it is assumed that channel widths of the N-channel TFTs 330, 332, 334, and 335, and P-channel TFTs 331, 333, 336, and 337 be 2 µm, 2 µm, 5 µm, 5 µm, 4 µm, 4 µm, 5 µm, and 5 µm.

In this case, the total of each TFT size is as long as 62 µm in the case of FIG. 3C while 100 µm in the case of FIG. 3A. Therefore, it is highly probable that the layout area can be decreased in the case of FIG. 3C. Further, a current consumption required for discharging gate capacitance of each TFT at the time of circuit operation is smaller in FIG. 3C. Therefore, it is highly probable that the overall current consumption can be decreased. Further, input capacitance of the standard cell can be considerably decreased in the case of FIG. 3C.

In order to increase an output driving capacity of the standard cell, it is also effective to form the logic circuit 239 on the output side by a plurality of NOT gate circuits, for example. In this case, it is possible to form the logic circuit on the input side by a TFT of which channel width is smaller, thus input capacitance of the standard cell can be further decreased. Moreover, it is possible to further decrease a gate delay and a layout area.

However, the layout area or the current consumption is actually decreased, depending largely on a specific circuit configuration, a design rule of a mask, TFT characteristics and the like. Therefore, it is also effective to form a functional circuit by combining the standard cell of a similar circuit configuration to this embodiment mode and a standard cell of a different circuit configuration according to a constraint in design.

Note that the point of the invention is to decrease input capacitance of the standard cell while increasing a driving capacity, therefore, a division of a logic circuit on an input side and a logic circuit on an output side is not necessarily important. For example, in FIG. 2C, the logic circuit 238 on the input side of the NOR cell may be formed of the NOT gate circuits 234 and 235, and the logic circuit 239 on the output side may be formed of the NAND gate circuit 236 and the NOT gate circuit 237. Similarly, the logic circuit 248 on the input side of the NAND cell may be formed of the NOT gate circuits 244 and 245, and the logic circuit 249 on the output side may be formed of the NOR gate circuit 246 and the NOT gate circuit 247 in FIG. 2D.

Note that in this embodiment mode, a NOR cell and a NAND cell are taken as an example of the standard cell of which logic circuit on the input side and the logic circuit on the output side are each formed of a gate circuit, however, other gate cells such as a NOT cell, an OR cell, an AND cell, an XOR cell, and an XNOR cell may be formed similarly. That is, the logic circuit on the input side and the logic circuit on the output side can each be formed of a gate circuit.

Further, a sequential cell such as an FF cell and a LAT cell may be formed similarly by providing a sequential circuit to at least one of the logic circuit on the input side and the logic circuit on the output side.

As described above, by forming the standard cell divided into the logic circuit on the input side and the logic circuit on the output side, an operating speed of a functional circuit can be estimated at a high precision at the time of logic synthesis even when the precision of estimation by the wiring capacitance model is not good. That is, a reliability of the logic synthesis result is improved, therefore, the logic synthesis and an automatic routing of layout are not required to be repeated, which can shorten the design period. Therefore, a semiconductor device having a low-cost and high performance functional circuit can be provided. Furthermore, by mounting such a functional circuit on the same substrate, a low-cost, thin, lightweight, high definition, and low power consumption display device can be provided.

Embodiment 1

In this embodiment, a display device comprising a functional circuit formed of a CPU, an SRAM and the like is mounted on the same substrate is described as an example of a display device of the invention.

Figure 4:
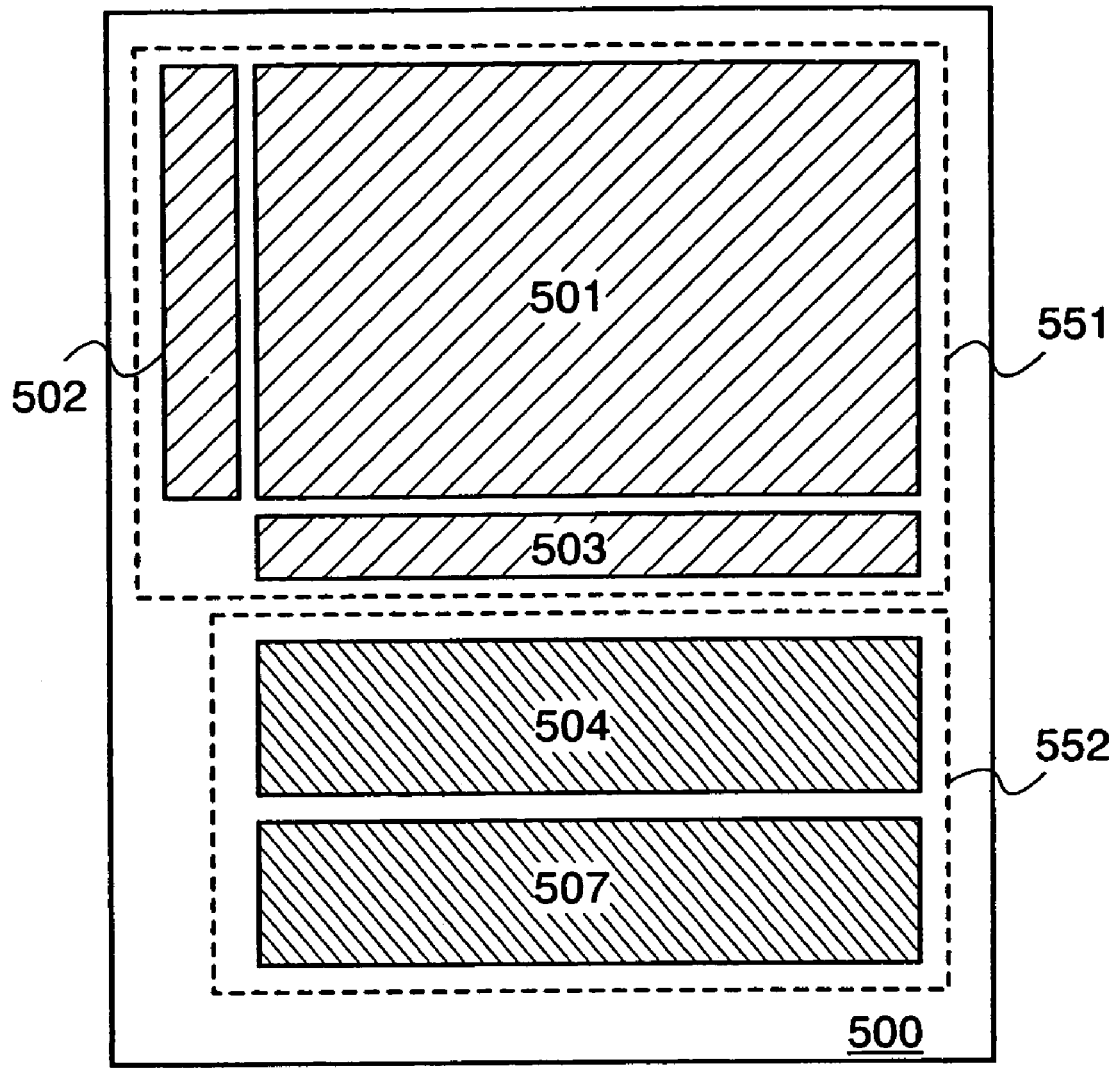
FIG. 4 is a top plan view of a display device of the invention.

FIG. 4 is a top plan view of a display device of this embodiment. In FIG. 4, a display device comprises a display portion 551 and a functional circuit 552 formed by using TFTs formed on a substrate 500 having an insulating surface. The display portion 551 comprises a pixel portion 501, a scan driver circuit 502, and a signal driver circuit 503. Further, the functional circuit 552 comprises a CPU 507 and an SRAM (memory circuit) 504. The pixel portion 501 displays an image in the display portion 551. Further, an input of an image signal to each pixel of the pixel portion 501 is controlled by the scan driver circuit 502 and the signal driver circuit 503. The SRAM 504 is formed of a plurality of memory cells (not shown) arranged in matrix. Each of the memory cells comprises such a function as to store a signal inputted to and outputted from the CPU 507. Moreover, the CPU 507 comprises such a function as to output a control signal to the scan driver circuit 502 and the signal driver circuit 503.

Figure 5:
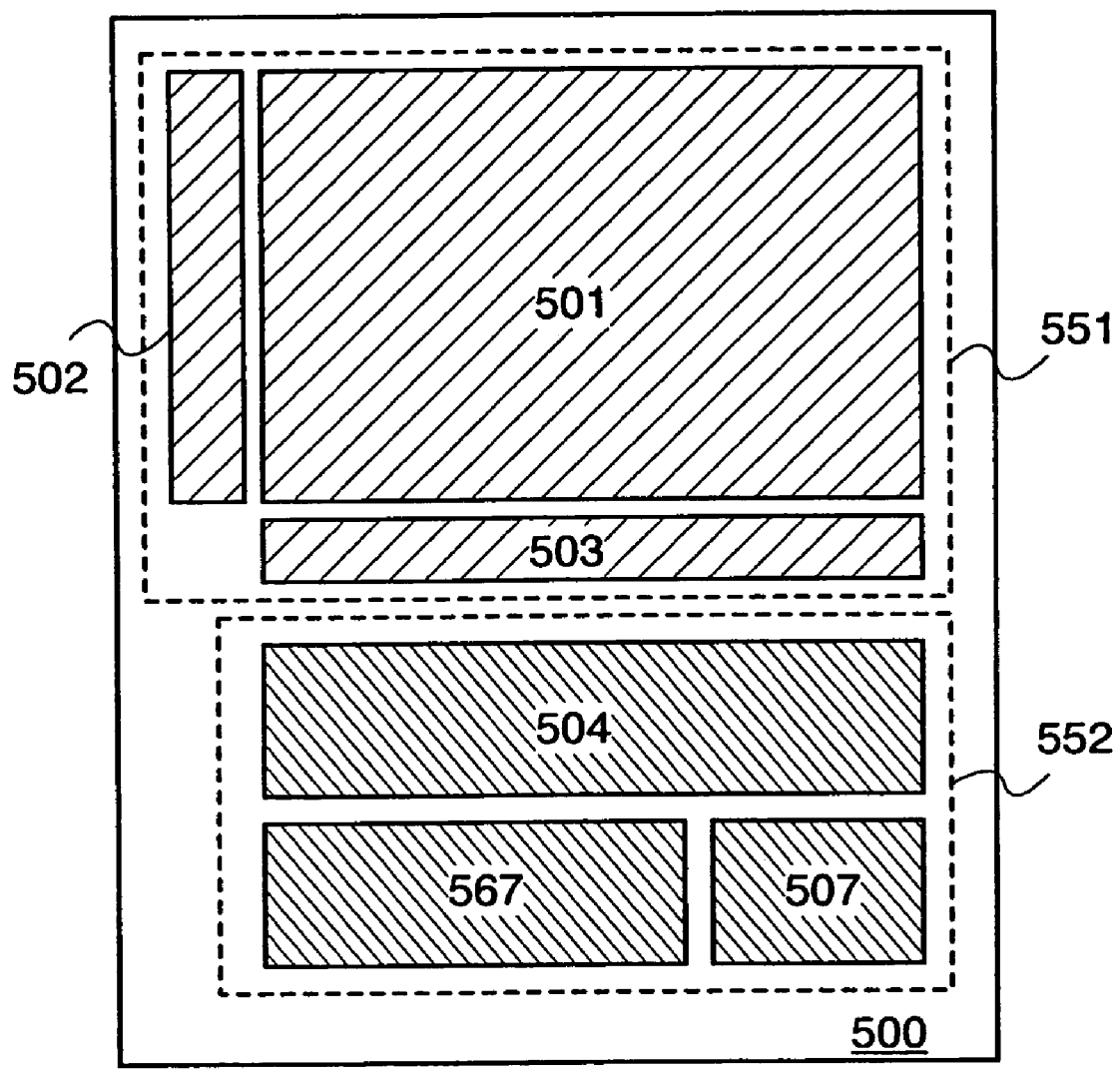
FIG. 5 is a top plan view of a display device of the invention.

The functional circuit 552 may comprise a GPU (Graphic Processing Unit) 567. FIG. 5 shows this configuration. Note that the same portion as those in FIG. 5 are described by using the same numerals and the description is omitted here. A signal inputted from outside of the substrate 500 is converted into a signal to be inputted to the display portion 551 by the GPU 567.

In FIGS. 4 and 5, a liquid crystal display device or a display device using a self-light emitting element can be used as the display portion 551.

In designing the functional circuit 552, a small-area, low power consumption, and high operating speed are required to be realized in as short period as possible. Therefore, the method described in the embodiment mode is effective. Accordingly, a design period of the functional circuit 552 can be shortened and a low-cost and high performance functional circuit can be provided. Further, by mounting such a functional circuit on the same substrate, a low-cost, thin, lightweight, high definition, and low power consumption display device can be provided.

Embodiment 2

In this embodiment, an example of a fabricating method of TFT in the display device described in Embodiment 1 comprising a functional circuit on the same substrate is described with reference to FIGS. 6A to 6H. Note that the fabricating method of TFT in a functional circuit portion can be applied to a fabricating method of a semiconductor device provided by the invention as it is.

Figure 6A:
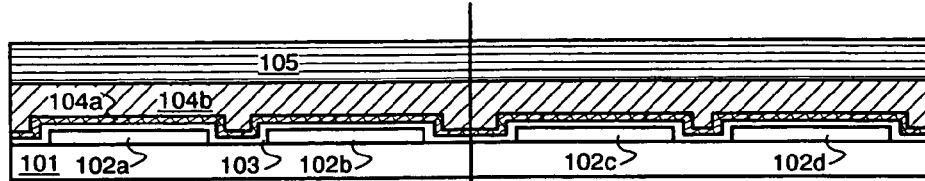
FIGS. 6A to 6H are diagrams showing a manufacturing method of TFTs in a display device of the invention.

In FIG. 6A, a quartz substrate, a silicon substrate, a metal substrate or a stainless substrate on whose surface is formed an insulating film is used for a substrate 100. Alternatively, a heat-resistant plastic substrate which can resist the processing temperature of this fabricating process may be used as well. In this embodiment, the substrate 101 formed of such a glass as barium borosilicate glass and aluminoborosilicate glass is used.

Subsequently, a base film (not shown) formed of an insulating film such as a silicon oxide film, a silicon nitride film, and a silicon oxynitride film is formed on the substrate 101. The base film may have a structure that a single or two or more insulating films may be laminated.

As a first layer of the base film, a silicon nitride oxide film is formed in a thickness of 10 to 200 nm (preferably 50 to 100 nm) which is formed with $SiH_4$, $NH_3$, and $N_2O$ as reaction gas by plasma CVD. In this embodiment, the silicon nitride oxide film is formed in a thickness of 50 nm. Subsequently, as a second layer of the base film, a silicon oxynitride film formed with $SiH_4$ and $N_2O$ as reaction gas is formed in a thickness of 50 to 200 nm (preferably 100 to 150 nm) by plasma CVD. In this embodiment, the silicon oxynitride film is formed in a thickness of 100 nm.

Subsequently, a semiconductor film is formed on the base film. The semiconductor film is formed in a thickness of 25 to 80 nm (preferably 30 to 60 nm) by a known means (sputtering, LPCVD, plasma CVD and the like). Next, the semiconductor film is crystallized by a known crystallization method (a laser crystallization method, a thermal crystallization method using an RTA or a furnace anneal, a thermal crystallization method using a metal element which promotes crystallization and the like). Note that the thermal crystallization method using a metal element which promotes crystallization and the laser crystallization method may be combined as well. For example, after the thermal crystallization using a metal element which promotes crystallization, the laser crystallization method may be performed as well.

Then, the obtained crystalline semiconductor film is patterned into a desired shape to form semiconductor layers (semiconductor active layers) 102a to 102d. Note that such as a non-crystalline semiconductor film, a micro crystalline semiconductor film, a crystalline semiconductor film, and a compound semiconductor film having a non-crystalline structure such as a non-crystalline silicon germanium film can be used as the semiconductor layer.

In this embodiment, a non-crystalline silicon film in a thickness of 55 nm is formed by plasma CVD. Then, a solution including nickel is held on the non-crystalline silicon film, which is dehydrogenated and then thermal crystallized to form a crystalline silicon film. After that, the island shape semiconductor layers 102a to 102d are formed through patterning by photolithography.

Note that, when the crystalline semiconductor film is formed by a laser crystallization method, a gas laser or a solid laser, which conducts continuous oscillation or pulse oscillation is preferably used as the laser. An excimer laser, a YAG laser, a $YVO_4$ laser, a YLF laser, a $YAlO_3$ laser, a glass laser, a ruby laser, a Ti: sapphire laser, and the like can be used as the former gas laser. In addition, a laser using a crystal such as YA, $YVO_4$, YLF or $YAlO_3$, which is doped with Cr, Nd, Er, Ho, Ce, Co, Ti, or Tm can be used as the latter solid laser. Note that, in order to obtain a crystal having a large grain size at the crystallization of the amorphous semiconductor film, it is preferable that a solid laser capable of conducting continuous oscillation is used and a second harmonic to a fourth harmonic of the fundamental are applied. Typically, a second harmonic (532 nm) or a third harmonic (355 nm) of an Nd: $YVO_4$ laser (fundamental of 1064 nm) is applied.

Also, when the above laser is used, it is preferable that a laser beam emitted from a laser oscillator is linearly condensed by an optical system and irradiated to the semiconductor film. A crystallization condition is set as appropriate. When an excimer laser is used, it is preferable that a pulse oscillation frequency is set to 300 Hz and a laser energy density is set to 100 to 700 $mJ/cm^2$ (typically, 200 to 300 $mJ/cm^2$). In addition, when a YAG laser is used, it is preferable that the second harmonic is used, a pulse oscillation frequency is set to 1 to 300 Hz, and a laser energy density is set to 300 to 1000 $mJ/cm^2$ (typically, 350 to 500 $mJ/cm^2$).

However, in this embodiment, the amorphous silicon film is crystallized using a metal element for promoting crystallization so that the metal element remains in the crystalline silicon film. Thus, an amorphous silicon film in a thickness of 50 to 100 nm is formed on the crystalline silicon film, heat treatment (thermal anneal using an RTA method or a furnace anneal furnace and the like) is conducted to diffuse the metal element into the amorphous silicon film, and the amorphous silicon film is removed by etching after the heat treatment. As a result, the metal element contained in the crystalline silicon film can be reduced or removed.

Note that, after forming the island shape semiconductor layers 102a to 102d, doping with a trace impurity element (boron or phosphorus) may be conducted. Thus, by also adding a trace impurity element to a region which is to be a channel region, a threshold value of a TFT can be controlled.

Next, a gate insulating film 103 covering the semiconductor layers 102a to 102d is formed. The gate insulating film 103 is formed of an insulating film containing silicon in a thickness of 40 to 150 nm by plasma CVD or sputtering. In this embodiment, a silicon oxynitride film is formed as the gate insulating film 103 in a thickness of 115 nm by plasma CVD. Of course, the gate insulating film 103 is not limited to the silicon oxynitride film. Another insulating film containing silicon may be used in a monolayer or a laminated structure. Note that, when a silicon oxide film is used as the gate insulating film 103, plasma CVD is employed with TEOS (Tetraethyl Ortho Silicate) and $O_2$ mixed, a reactive pressure is set to 40 Pa, a substrate temperature is set at 300 to 400° C. Then, discharge may occur at a high frequency (13.56 MHz) and power density of 0.5 to 0.8 W/cm$^2$ to form the silicon oxide film, for example. After that, when thermal anneal is conducted at 400 to 500° C. for the silicon oxide film formed by the above steps, the gate insulating film 103 having a preferable property can be obtained.

Subsequently, a first conductive layer 104a is formed in a thickness of 20 to 100 nm with tantalum nitride (TaN), and a second conductive layer 104b is formed to have a thickness of 100 to 400 nm with tungsten (W). Thus, a 1st wiring layer having a two-layer laminated structure is formed. In this embodiment, the first conductive layer 104a formed of TaN film in a thickness of 30 nm and the second conductive layer 104b formed of W film in thickness of 370 nm are formed to be laminated.

In the this embodiment, a TaN film which is the first conductive layer 104a is formed in the atmosphere containing nitrogen using the target of Ta by sputtering. Moreover, a W film which is the second conductive layer 104b is formed using the target of W by sputtering. Besides, it can also be formed by thermal CVD using tungsten hexafluoride ($WF_6$). Whatever the case may be, it is required that the resistance be low for using as a gate electrode. It is preferable that the resistivity of the W film be 20 μΩcm or less.

It should be noted that the first conductive layer 104a is formed of TaN film, the second conductive layer 104b is formed of W film, but materials for forming the first conductive layer 104a and the second conductive layer 104b are not particularly limited. The first conductive layer 104a and the second conductive layer 104b may be formed of an element selected from Ta, W, Ti, Mo, Al, Cu, Cr and Nd, or with an alloy material or a compound material having the foregoing element as a main component. Moreover, it may also be formed of a semiconductor film represented by a polycrystalline silicon film in which an impurity element such as phosphorus is doped or Ag—Pd—Cu alloy.

Note that a conductive layer formed of the first conductive layer 104a and the second conductive layer 104b corresponds to the 1st wiring layer described in embodiment mode.

Next, a resist 105 is formed as a film. As a method of forming the resist 105, a coating method can be employed. It should be noted that for an application method, a spin coater or a roll coater may be used. As for the resist 105, either one of positive-type and negative-type is capable of being used, which can be selected according to the light source used at the time of exposure.

Figure 6B:
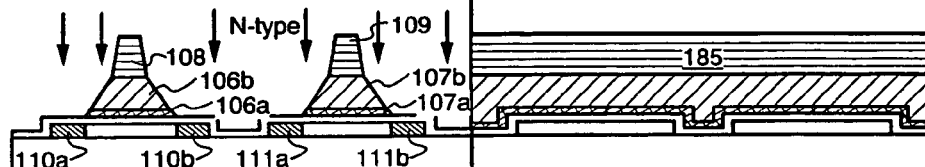

Subsequently, as shown in FIG. 6B, the resist masks 108, 109 and 185 are formed by exposing the resist 105 to light (first exposure) and the first etching treatment (1st wiring layer etching 1) is carried out for fabricating a gate wiring. In this embodiment, using ICP (Inductively Coupled Plasma) etching method as a procedure of etching of the first etching treatment, $CF_4$ and $Cl_2$ are mixed for etching gas, it is etched by generating plasma by providing the RF power (13.56 MHz) of 500 W into a coil type electrode at a pressure of 1 Pa. The RF (13.56 MHz) power of 100 W is also provided on the substrate side (sample stage) to substantially apply a negative self-bias voltage. In the case where $CF_4$ and $Cl_2$ are mixed, both of W film and Ta film are etched to a similar extent.

However, the portions of the first conductive layer 104a and the second conductive layer 104b formed on the semiconductor layers 102c and 102d are not etched because these portions are covered with a resist mask 185.

Under the aforementioned etching conditions, by shaping the resist mask suitably, the edge portions of the first conductive layers 106a, 107a and the second conductive layers 106b, 107b are made in a tapered shape by the effect of bias voltage applied to the substrate side. Here, an angle (taper angle) of the portion having a tapered shape (tapered portion) is defined as an angle formed between the surface of the substrate 101 (horizontal surface) and the slanted portion of the tapered portion. The angle of the tapered portion of the first conductive layer and the second conductive layer can be made at an angle in the range from 15 to 45° by appropriately selecting the etching conditions. In order to etch without remaining residue on the gate insulating film 103, the etching time is preferably increased by the ratio of about 10 to 20%. Since the selection ratio of a silicon oxynitride film with respect to a W film is in the range from 2 to 4 (typically, 3), the surface in which the silicon oxynitride film has been exposed is to be etched by about 20 to 50 nm by an over etching treatment. Thus, the conductive layers 106, 107 (first conductive layers 106a, 107a and second conductive layers 106b, 107b) of the first shape consisted of the first conductive layer and the second conductive layer are formed by the first etching treatment. At this time, in the gate insulating film 103, the exposed region is etched by about 20 to 50 nm, and the thinned regions are formed.

Then, an impurity element which imparts the N-type conductivity is added by the first doping treatment (doping 1). As for the doping method, it may be performed by an ion doping method or an ion implantation method. As for the conditions for the ion doping method, the dosage is set in the range from $1 \times 10^{13}$ to $5 \times 10^{14}$ atoms/cm$^2$ and the acceleration voltage is set in the range from 60 to 100 kV. As an impurity element which imparts the N-type conductivity, an element belonging to 15 group, typically, phosphorus (P) or arsenic (As) are employed. Here, phosphorus (P) is employed. In this case, first impurity regions 110a, 110b, 111a and 111b are formed in a self-aligned manner by utilizing the conductive layers 106 and 107 of the first shape (the first conductive layers 106a, 107a and the second conductive layers 106b and 107b) as masks for an impurity element which imparts the N-type impurity. An impurity element which imparts the N-type impurity in the concentration range from $1 \times 10^{20}$ to $1 \times 10^{21}$ atoms/cm$^3$ is added to the first impurity regions 110a, 110b, 111a and 111b.

Figure 6C:
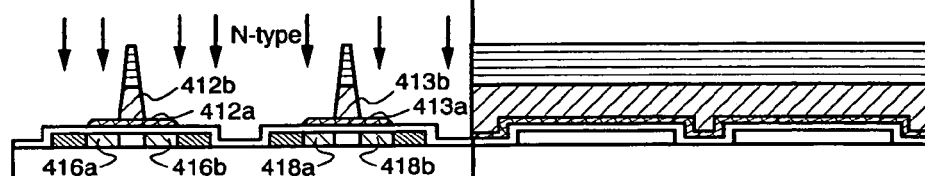

Next, as shown in FIG. 6C, the second etching treatment (1st wiring layer etching 2) is carried out with the resist mask unremoved. The W film is selectively etched by using $CF_4$, $Cl_2$ and $O_2$ as etching gases. Thus, the conductive layers 412 and 413 of the second shape (first conductive layers 412a, 413a and the second conductive layers 412b, 413b) are formed. At this time, in the gate insulating film 103, the exposed region is further etched by about 20 to 50 nm, and becomes thinned.

Then, the second doping treatment (doping 2) is carried out. In this case, the dosage is decreased than that of the first doping treatment, and an impurity element which imparts the N-type conductivity is doped under the condition of a high acceleration voltage. For example, under the condition of the acceleration voltage set at 70 to 120 kV, the dosage is $1 \times 10^{13}$ atoms/cm$^2$, and a new impurity region is formed inside the first impurity regions 110a, 111b, 111a and 111b formed on the island shape semiconductor layer of FIG. 2B. The doping is carried out using the second conductive layers 412b and 413b as masks for an impurity element so that an impurity element is also added to the semiconductor layers of the lower regions below the first conductive layers 412a and 413a. Thus, the second impurity regions 416a, 416b, 418a and 418b are formed. The concentration of phosphorus (P) added to these second impurity regions 416a, 416b, 418a and 418b has a slow concentration gradient according to the film thickness of the tapered portions of the first conductive layers 412a and 413a. Noted that although the impurity concentration is slightly lowered from the edge portion of the tapered portions of the first conductive layers 412a, 413a toward the inside in the semiconductor layer overlapped with the tapered portions of the first conductive layers 412a and 413a, the concentration is approximately the same.

Figure 6D:
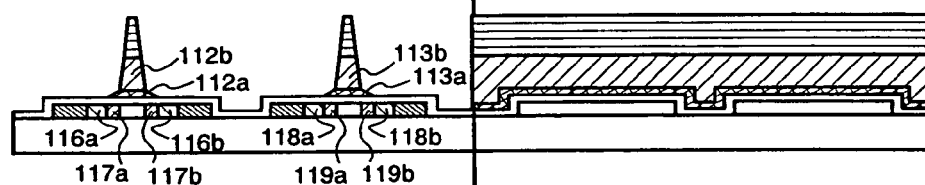

As shown in FIG. 6D, a third etching treatment (1st wiring layer etching 3) is performed. This is performed by using a reactive ion etching method (RIE method) with an etching gas of $CHF_6$. The tapered portions of the first conductive layers 412a and 413a are partially etched, and the region in which the first conductive layers overlap with the semiconductor layer is reduced by the third etching treatment. Conductive layers 112 and 113 (first conductive layers 112a and 113a and second conductive layers 112b and 113b) of the third shape are formed. At this point, exposed regions of the gate insulating film 103 are made thinner by about 20 to 50 nm by etching. By the third etching treatment, in the second impurity regions 416a, 416b, 418a, and 418b, second impurity regions 117a, 117b, 119a, and 119b, which overlap with the first conductive layers 112a and 113a, and third impurity regions 116a, 116b, 118a, and 118b between the first impurity regions and the second impurity regions are formed.

Figure 6E:
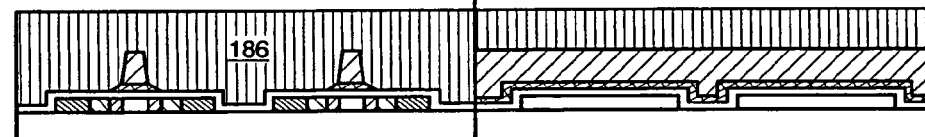
Figure 6F:
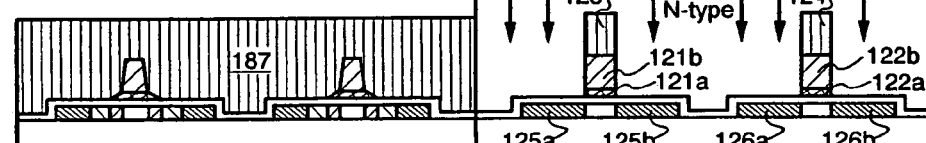

Subsequently, as shown in FIG. 6E, after the resist masks 108, 109 and 185 are removed, a resist 186 is newly formed as a film. As the film forming method of the resist 186, a coating method can be employed. It is to be noted that a spin coater or a roll coater may be used for a coating method. As for the resist 186, either one of positive-type and negative-type can be used and selected according to the light source used at the time of exposure. It is to be noted that the material for the resist 186 may be the same with that of the resist 105 used at the time of the first exposure, or may be different from that.

Subsequently, the resist 186 is exposed to light (second exposure), thereby forming resist masks 123, 124 and 187 (FIG. 4F). It is to be noted that exposure means used in the second exposure may be the same as that of the first exposure, or may be different from that. Then, the fourth etching treatment (1st wiring layer etching 4) is carried out. Accordingly, conductive layers 121 and 122 of the fourth shape (first conductive layers 121a and 122a, and second conductive layers 121b and 122b) each having an approximately perpendicular edge portion are formed. It is to be noted that since the portions of the conductive layers 112 and 113 of the third shape (the first conductive layers 112a and 113a and the second conductive layers 112b and 113b) formed over the semiconductor layers 102a and 102b are covered with the resist mask 187, these are not etched.

Subsequently, the third doping treatment (doping 3) is carried out. In the third doping treatment, an impurity element which imparts N-type conductivity is added. A doping method may be carried out by an ion doping method or an ion implantation method. As the conditions of an ion doping method, the dosage is set in the range from $1\times10^{13}$ to $5\times10^{14}$ atoms/cm$^2$, and the acceleration voltage is set in the range from 60 to 100 kV. An element belonging to 15 group, typically, phosphorus (P) or arsenic (As) is used as an impurity element which imparts N-type conductivity. Phosphorus (P) is used in this embodiment. In this case, fourth impurity regions 125a, 125b, 126a and 126b are formed by utilizing the resist masks 123, 124 and 187 as masks for adding the impurity element which imparts N-type conductivity. An impurity element which imparts N-type conductivity is added to the fourth impurity regions 125a, 125b, 126a and 126b in the concentration range from $1\times10^{20}$ to $1\times10^{21}$ atoms/cm$^3$. It is to be noted that since the semiconductor layers 102a and 102b are covered with the resist mask 187, an impurity element is not added by the third doping treatment.

In this embodiment, the conditions of the doping of an impurity element to the fourth impurity regions 125a, 125b, 126a and 126b (third doping treatment) are made as the same as the conditions of the doping of an impurity element applied to the first impurity regions 110a, 110b, 111a and 111b (first doping treatment). However, the condition is not limited to this. The conditions may be different in the first doping treatment and the third doping treatment.

Figure 6G:
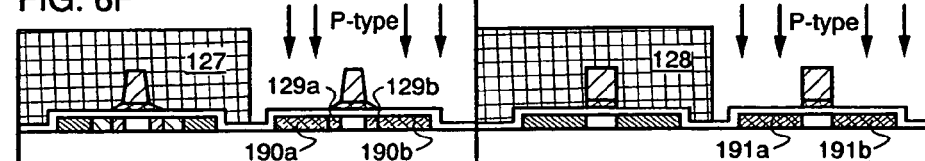

Subsequently, as shown in FIG. 6G, after the resist masks 187, 123 and 124 are removed, resist masks 127 and 128 are newly formed, and the fourth doping treatment (doping 4) is carried out. In the fourth doping treatment, an impurity element which imparts P-type conductivity is added. As for a doping method, an ion doping method or an ion implantation method may be employed. In the island shape semiconductor layers 102b and 102d for forming a P-channel type TFT, the fourth impurity regions 190a, 190b, 191a, 191b, 129a and 129b to which a P-type impurity element is added are formed. At this time, the impurity region is formed in a self-aligned manner by utilizing the conductive layer 113b of the third shape and the conductive layer 122 of the fourth shape as masks for the impurity element. It is to be noted that the island shape semiconductor layers 102a and 102c for forming an N-channel type TFT are covered with the resist masks 127 and 128 entirely.

Phosphorus (P) is added in the respective different concentrations to the fourth impurity regions 190a, 190b, 191a, 191b, 129a and 129b by performing the first doping treatment, the second doping treatment and the third doping treatment. However, an impurity element which imparts P-type conductivity is added to any of the regions by an ion doping method using diborane ($B_2H_6$). At this time, it is added so that the concentration of an impurity element which imparts P-type conductivity in the fourth impurity regions 190a, 190b, 191a and 191b is in a concentration range from $2\times10^{20}$ to $2\times10^{21}$ atoms/cm$^2$. Thus, the fourth impurity regions 190a, 190b, 191a and 191b function as the source region and the drain region of the P-channel type TFT without any problem. Moreover, the fourth impurity regions 129a and 129b function as the Lov region of the P-channel type TFT without any problem.

By means of the aforementioned process, impurity regions are formed in the respective semiconductor layers 102a to 102d. The conductive layers of the third shape 112 and 113 and the conductive layers of the fourth shape 121 and 122 overlapped with the island shape semiconductor layer function as gate wirings.

Figure 6H:
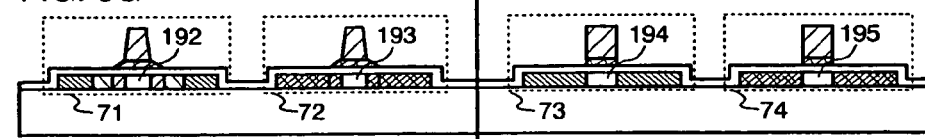

Thus, as shown in FIG. 6H, an N-channel type TFT 71, a P-channel type TFT 72, an N-channel type TFT 73 and a P-channel type TFT 74 are formed.

The N-channel type TFT 71 includes a channel region 192, high concentration impurity regions 110a and 110b corresponding to a source region and a drain region, low concentration impurity regions (Lov regions) 117a and 117b which are overlapped with the gate wiring, low concentration impurity regions (Loff regions) 116a and 116b which are not overlapped with the gate wiring. On the other hand, the P-channel type TFT 72 includes a channel region 193, high concentration impurity regions 190a and 190b corresponding to a source region and a drain region, and low concentration impurity regions (Lov regions) 129a and 129b which are overlapped with the gate wiring. It is to be noted that it is formed in such a structure that it does not have a Loff regions. The gate wirings of the N-channel type TFT 71 and the P-channel type TFT 72 have an edge portion in a tapered shape. Therefore, these are TFTs in a shape which is not suitable in order to make the gate wiring smaller. However, since the Lov regions and the Loff regions can be formed in a self-aligned manner in the gate wiring manufacturing step, the number of steps in manufacturing the TFT can be suppressed. Thus, a TFT having a high withstanding voltage can be formed while the number of steps is reduced.

Moreover, the N-channel type TFT 73 includes a channel region 194 and a high concentration impurity regions 125a and 125b corresponding to a source region and a drain region. Moreover, the P-channel type TFT 74 includes a channel region 195 and high concentration impurity regions 191a and 191b corresponding to a source region and a drain region. The N-channel type TFT 73 and the P-channel type TFT 74 are formed in a signal drain structure. In the case where the N-channel type TFT 73 and P-channel type TFT 74 are made TFTs having the Lov regions and the Loff regions, there are problems that a new mask is required and the number of steps is increased. However, since the edge portions of the gate wiring are etched in the perpendicular direction, the refining can be carried out.

For example, the N-channel type TFT 71 and the P-channel type TFT 72 can be suitably applied to a circuit in which the withstanding voltage is required such as a display portion, while the N-channel type TFT 73 and the P-channel type TFT 74 can be suitably applied to a circuit in which the refining is required such as a functional circuit portion.

It is to be noted that the exposure means used in the step of performing the first exposure and the exposure means used in the step of performing the second exposure may be the same or different from each other. Here, in general, as the wavelength of the radiation energy source used for exposure is shorter, the resolution at the time of exposure becomes higher. Hence, for example, in the case where the N-channel type TFT 73 and the P-channel type TFT 74 are required to be refined rather than the N-channel type TFT 71 and the P-channel type TFT. 72, the wavelength of light used in the step of performing the second exposure is made shorter than the wavelength of light used in the step of the first exposure.

Moreover, an exposure apparatus used in the step of performing the first exposure and an exposure apparatus used in the step of performing the second exposure may be the same or can be made different from each other.

For example, in the case where the N-channel type TFT 73 and the P-channel type TFT 74 are required to be refined rather than the N-channel type TFT 71 and the P-channel type TFT 72, the exposure is carried out using an MPA in the step of performing the first exposure, and the exposure is carried out using a stepper in the step of performing the second exposure. Here, in general, in the case of the MPA, since a large area can be exposed at a time, it is advantageous in the productivity of semiconductor devices. On the other hand, in the case of the stepper, a pattern is exposed to the resist by projecting the pattern on a reticle by an optical system and operating and stopping (step and repeat) the stage on the substrate side. Comparing to the MPA, although a large area cannot be exposed at a time, the resolution of line and space (L&S) (hereinafter, a resolution means a resolution of L&S) can be enhanced.

Moreover, as another example, in the case where the N-channel type TFT 73 and the P-channel type TFT 74 are required to be refined rather than the N-channel type TFT 71 and the P-channel type TFT 72, in the step of performing the first exposure, a stepper whose reduction ratio is small at the time when the pattern on the reticle is projected on the resist by an optical system is used, and in the step of performing the second exposure, a stepper whose reduction ratio is large at the time when the pattern on the reticle is projected on the resist by an optical system is used. It is to be noted that the reduction ratio of a stepper is a value indicating N (N is an integer) at the time when the pattern on the reticle is projected on the resist by making it 1/N-fold. Here, in general, in the case of a stepper whose reduction ratio is large at the time when the pattern on the reticle is projected on the resist by an optical system, the area in which the exposure can be carried out at a time is narrow, but the resolution is high. On the other hand, in the case of a stepper whose reduction ratio is small at the time when the pattern on the reticle is projected on the resist by an optical system, the area in which the exposure can be carried out once is wide, but the resolution is low.

As described above, a semiconductor device having high productivity and a TFT having an excellent property can be fabricated by changing the exposure means in the steps of performing the first exposure and the second exposure. It is to be noted that the exposure means (that indicates both of exposure conditions and exposure apparatus) used in the steps of performing the first exposure and the second exposure is not limited to the aforementioned one. Known exposure means can be freely used. Moreover, the steps of performing the first exposure and the second exposure may be carried out by utilizing a plurality of exposure means, respectively.

It is to be noted that although in this embodiment, the step of fabricating a single gate type TFT has been described, a double gate structure or a multi-gate structure having the number of gates more than two is also available.

It is to be noted that in this embodiment, a top gate type TFT, and the steps of fabricating it are described. However, a method described in this embodiment can be also applied to a dual gate type TFT. It is to be noted that a dual gate type TFT is a TFT having a gate wiring superimposed above a channel region via an insulating film and a gate wiring superimposed below the channel region via an insulating film.

Moreover, the degree of freedom for the shape of an electrode, wirings and the like of an element except for TFT, formed of the 1st wiring layer can be increased when a method described in this embodiment is applied.

Emdodiment 3

In this embodiment, an example of fabricating a liquid crystal display device is described as an example of a display device described in Embodiment 1 in which a functional circuit is mounted on the same substrate. It is to be noted that a configuration of a display portion and a functional circuit and TFTs used therein can be identical to Embodiments 1 and 2.

Figure 7A:
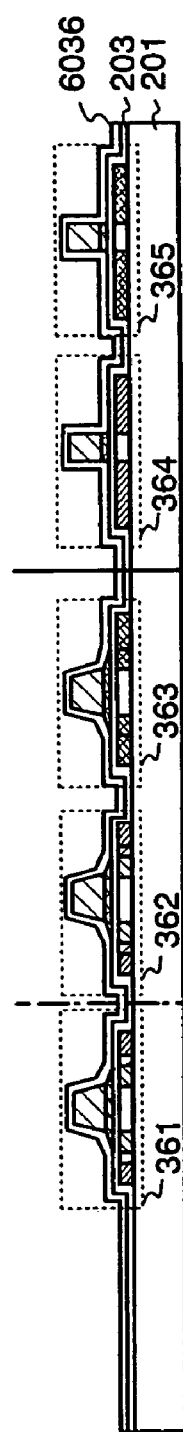
FIGS. 7A to 7C are diagrams showing a manufacturing method of a liquid crystal display device of the invention.
Figure 7B:
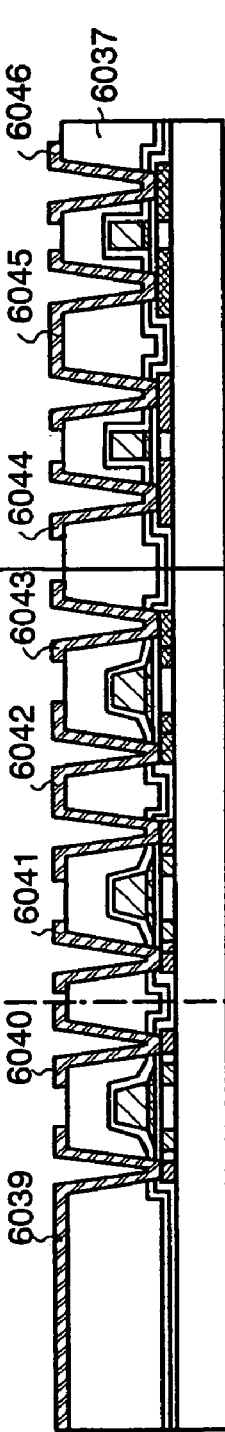
Figure 7C:
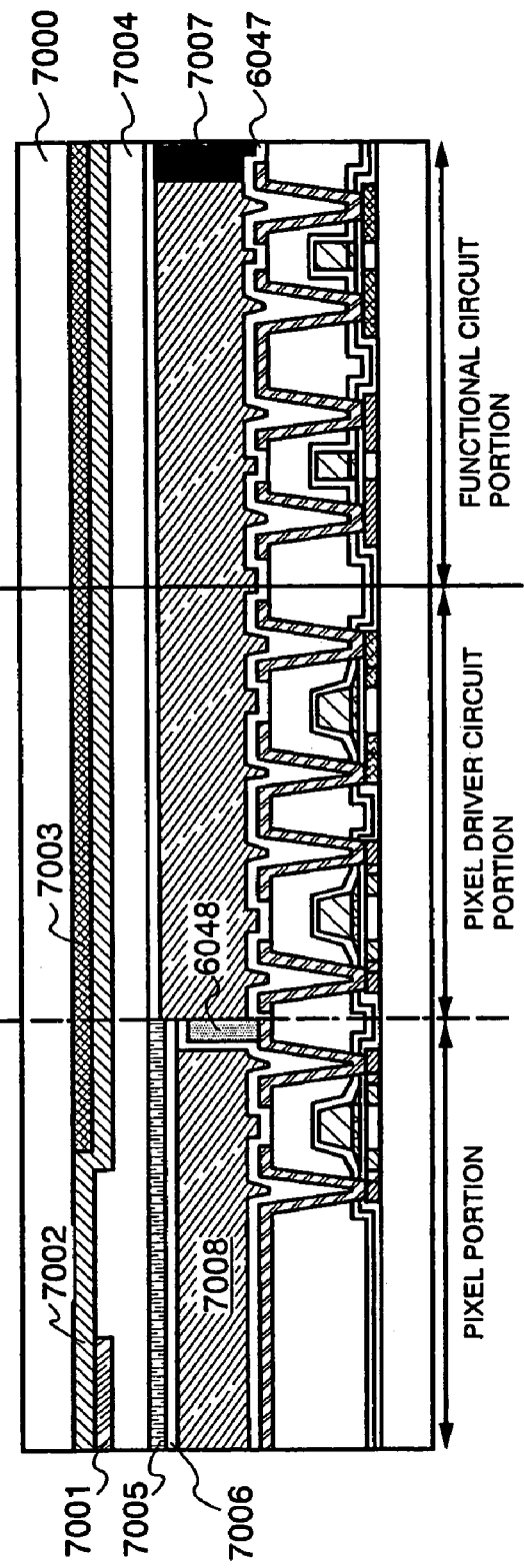

FIGS. 7A to 7C show sectional views of a display device of this embodiment. An N-channel type TFT 361 is shown to represent pixel TFTs which configure a pixel portion. Moreover, an N-channel type TFT 362 and a P-channel type TFT 363 are shown to represent elements which configure a pixel driver circuit portion. An N-channel type TFT 364 and a P-channel type TFT 365 are shown to represent elements which configure a functional circuit portion. The fabricating methods of the N-channel type TFTs 361 and 362, the P-channel type TFT 363, the N-channel type TFT 364 and the P-channel type TFT 365 are not described here as they are the same as the fabricating method described referring to FIGS. 6A to 6H in Embodiment 1.

As shown in FIG. 7A, a first interlayer insulating film 6036 is formed. The first interlayer insulating film 6036 is formed of an insulating film containing silicon in a thickness of 100 to 200 nm by utilizing plasma CVD or a sputtering. In this embodiment, a silicon oxynitride film is formed in a thickness of 100 nm by plasma CVD. Needless to say, the first interlayer insulating film 6036 is not limited to the silicon oxynitride film, an insulating film containing other silicon may be used in a monolayer structure or a laminated structure.

Recrystallization of a semiconductor layer and an activation of the impurity element which is added to the semiconductor layer are performed by thermal treatment. This thermal treatment is conducted by thermal annealing using furnace-annealing. As for the thermal annealing, it is conducted at the temperature ranging from 400 to 700° C. in the nitrogen atmosphere containing 1 ppm or less of, preferably 0.1 ppm or less of oxygen, it is performed at 410° C. for one hour in this embodiment. It is to be noted that laser annealing or rapid thermal annealing (RTA) can be employed as well as thermal annealing. The thermal treatment may be conducted before the first interlayer insulating film 6036 is formed. However, in the case where gate wirings of the N-channel type TFTs 361 and 362, the P-channel type TFT 363, the N-channel type TFT 364 and the P-channel type TFT 365 are sensitive to heat, it is preferable to perform the thermal treatment after the first interlayer insulating film 6036 (insulating film containing silicon as its main constituent, for example a silicon nitride film) is formed to protect the wirings or the like as in this embodiment.

As described above, when the thermal treatment is conducted after the formation of the first interlayer insulating film 6036 (insulating film containing silicon as its main constituent, for example a silicon nitride film), the hydrogenation of the semiconductor layer can also be conducted simultaneously with the activation. In the hydrogenation step, a dangling bond of the semiconductor layer is terminated by hydrogen contained in the first interlayer insulating film 6036. It is to be noted that thermal treatment for hydrogenation may be performed as well as to the thermal treatment for activation process.

Subsequently, as shown in FIG. 7B, a second interlayer insulating film 6037 is formed on the first interlayer insulating film 6036. An inorganic insulating film may be used as the second interlayer insulating film 6037. For example, a silicon oxide film formed by CVD, a silicon oxide film coated by SOG (Spin On Glass), or the like may be used. In addition, as the second interlayer insulating film 6037, an organic insulating film may be used. For example, a film made of polyimide, polyamide, BCB (benzocyclobutene), acrylic, or the like may be used. Further, a laminated structure of an acrylic film and a silicon oxynitride film may also be used. Also, a laminated structure of an acryl film and a silicon nitride film formed by sputtering or a silicon oxynitride film may be used. In this embodiment, an acrylic film in a thickness of 1.6 μm is formed. The second interlayer insulating film 6037 can reduce depression and projection due to the TFTs (the N-channel type TFTs 361 and 362, the P-channel type TFT 363, the N-channel type TFT 364 and the P-channel type TFT 365) and provide levelness. Particularly, the second interlayer insulating film 6037 is provided mainly for attaining levelness, and thus is preferably a film excellent in levelness.

Next, the second interlayer insulating film 6037, the first interlayer insulating film 6036, and a gate insulating film 203 are etched by using dry etching or wet etching, thereby forming contact holes that reach each source region and drain region of the N-channel type TFTs 361 and 362, the P-channel type TFT 363, the N-channel type TFT 364 and the P-channel type TFT 365. Subsequently, wirings 6040 to 6046 and a pixel electrode 6039 which are electrically connected to the source region and the drain region of each TFT are formed. It is to be noted that in this embodiment, the wirings 6040 to 6046 and the pixel electrode 6039 are formed by forming a laminate film of Ti film in a thickness of 50 nm and an alloy film of Al and Ti in a thickness of 500 nm continuously by sputtering, and patterning the laminate film in a desired shape. Needless to say, the invention is not limited to a two-layer structure, but a monolayer structure or a laminated structure of three or more layers may be adopted. Further, the materials for wirings are not limited to Al and Ti and other conductive layers may be employed. For example, the wirings may be formed by patterning a laminate film in which an Al film or a Cu film is formed on a TaN film and a Ti film is further formed thereon. In any cases, a material excellent in reflecting property is desirably used.

Subsequently, an alignment film 6047 is formed over a portion at least including the pixel electrode 6039, and rubbing is performed as shown in FIG. 7C. It is to be noted that in this embodiment, a columnar spacer 6048 for maintaining a substrate interval is formed at a desired position by patterning an organic resin film such as an acrylic resin film before the alignment film 6047 is formed. Further, a spherical spacer may be scattered over the surface of the substrate instead of the columnar spacer.

Subsequently, a counter substrate 7000 is prepared. Colored layers (color filters) 7001 to 7003 and a leveling film 7004 are formed over the counter substrate 7000. At this time, the first colored layer 7001 and the second colored layer 7002 are overlapped to form a light shielding portion, and the second colored layer 7002 and the third colored layer 7003 are partially overlapped to form a light shielding portion. Further, the first colored layer 7001 and the third colored layer 7003 may be partially overlapped to form a light shielding portion. In this way, a gap between pixels is shielded against light by the light shielding portion comprised of a lamination of the colored layers without newly forming a light shielding layer. The number of steps thus can be reduced.

Then, a counter electrode 7005 formed of a transparent conductive film is formed at least over a portion which corresponds to a pixel portion of the leveling film 7004, and an orientation film 7006 is formed over the whole surface of the substrate of the counter substrate 7005. Then, rubbing is performed.

Then, the substrate 201 on which the pixel portion, the driver circuit portion and the CPU portion are formed and the counter substrate 7000 are bonded to each other by a sealing material 7007. The sealing material 7007 is mixed with a filler (not shown), and the substrate 201 and the counter substrate 7000 are bonded while a uniform interval is kept by the filler and the columnar spacer 6048. Thereafter, a liquid crystal material 7008 is injected between the two substrates 201 and 7000, and completely sealed with a sealant (not shown). A known liquid crystal material may be used as the liquid crystal material 7008. Thus, a liquid crystal display device is completed.

Further, a polarizer and an FPC (not shown) are bonded to the liquid crystal display device. By using FPC, a terminal led out from the elements or circuits formed over a substrate 201 is connected to an external signal terminal are connected, thus completed as a product.

It is to be noted that in this embodiment, the reflective liquid crystal display device in which the pixel electrode 6039 is formed of a metal film excellent in reflecting property and a counter electrode 7005 is formed of a material which transmits light is exemplified, but it is not limited to this. For example, the invention can be applied to a transmission type liquid crystal display device in which the pixel electrode 6039 is formed of a material which transmits light and the counter electrode 7005 is formed of a material having the reflecting property. Moreover, the invention can also be applied to a semi-transmission type liquid crystal display device.

The embodiment can be implemented freely in combination with any one of Embodiment Mode and Embodiments 1 and 2.

Embodiment 4

In this embodiment, an example of manufacturing an OLED display device in which a light emitting element is disposed in each pixel is shown as an example of a display device of Embodiment 1 in which a functional circuit is mounted on the same substrate. It should be noted that configurations of the display portion and the functional circuit and TFTs used for the circuits can be similar to those of Embodiments 1 and 2.

A light emitting element has a structure having an anode, a cathode and an organic compound layer sandwiched between the anode and the cathode. The light emitting element emits light when a voltage is applied between the anode and the cathode. The organic compound layer can be made in a laminated structure. Representatively, a laminated structure of hole transporting layer/light emitting layer/electron transporting layer is known. Besides, a structure in which hole injection layer/hole transporting layer/light emitting layer/electron transporting layer are laminated in this order on the anode, or hole injection layer/hole transporting layer/light emitting layer/electron transporting layer/electron injection layer are laminated in this order on the anode may be employed. Fluorescent pigment or the like may be doped into the light emitting layer. All of the layers provided between the cathode and the anode of a light emitting element is collectively referred to as an organic compound layer. Hence, the hole injection layer, hole transporting layer, light emitting layer, electron transporting layer, electron injection layer and the like are all included in the organic compound layer. When the predetermined voltage is applied from a pair of electrodes (anode and cathode) to the organic compound layer of the aforementioned structure, light is emitted by recombination of carriers in the light emitting layer. It is to be noted that a light emitting element may be of one of an element utilizing light emission from singlet exciton (fluorescence) and an element utilizing light emission from triplet exciton (phosphorescence). Since an OLED display device has advantages such that it is excellent in responsibility, operates at a low voltage, and has a wide viewing angle and so forth, it is drawing attention as a flat panel display of the next generation.

In FIGS. 8A to 8D, sectional views of a semiconductor device formed by using the invention are shown. As for a TFT constituting a pixel portion, a TFT connected in series to a light emitting element is representatively shown as the N-channel type TFT 361. Moreover, as an element consisting a pixel driver circuit portion, the N-channel type TFT 362 and the P-channel type TFT 363 are representatively shown. As an element constituting a CPU portion, the N-channel type TFT 364 and the P-channel type TFT 365 are representatively shown. Since a method of fabricating the N-channel type TFTs 361 and 362, the P-channel type TFT 363, the N-channel type TFT 364 and the P-channel type TFT 365 is similar to a method of fabrication shown in FIGS. 6A to 6H in Embodiment 2, the description is omitted here.

According to Embodiment 2, the semiconductor device is fabricated up to the state of FIG. 8A. In FIG. 8B, a first interlayer insulating film 5036 is formed. This first interlayer insulating film 5036 is formed of an insulating film containing silicon in a thickness of 100 to 200 nm by plasma CVD or sputtering. In this embodiment, a silicon oxynitride film having a thickness of 100 nm is formed by plasma CVD. Needless to say, the first interlayer insulating film 5036 is not limited to the silicon oxynitride film, and another insulating film containing silicon may be used as a monolayer structure or a laminated structure. Subsequently, recrystallization of a semiconductor layer and an activation of the impurity element which is added to the semiconductor layer are performed by thermal treatment. This thermal treatment is conducted by thermal annealing using furnace-annealing. As for the thermal annealing, it is conducted at the temperature ranging from 400 to 700° C. in the nitrogen atmosphere containing 1 ppm or less, preferably 0.1 ppm or less of oxygen, it is performed at 410° C. for one hour in this embodiment. It is to be noted that laser annealing or rapid thermal annealing (RTA) can be employed besides thermal annealing. Furthermore, the thermal treatment may be conducted before the first interlayer insulating film 5036 is formed. However, in the case where gate electrodes of the N-channel type TFTs 361 and 362, the P-channel type TFT 363, the N-channel type TFT 364 and the P-channel type TFT 365 are sensitive to heat, it is preferable to perform the thermal treatment after the first interlayer insulating film 5036 (insulating film containing silicon as its main constituent, for example a silicon nitride film) is formed to protect the wirings and the like as in this embodiment.

As described above, when the thermal treatment is conducted after the formation of the first interlayer insulating film 5036 (insulating film containing silicon as its main constituent, for example a silicon nitride film), the hydrogenation of the semiconductor layer can also be conducted simultaneously with the activation. In the hydrogenation step, a dangling bond of the semiconductor layer is terminated by hydrogen contained in the first interlayer insulating film 5036. It is to be noted that thermal treatment for hydrogenation may be performed besides the thermal treatment for activation step. Here, the semiconductor layers can be hydrogenated irrespective of the existence of the first interlayer insulating film 5036. As other means for hydrogenation, means using hydrogen excited by plasma (plasma hydrogenation) or means using thermal treatment at the temperature ranging from 300 to 450° C. for 1 to 12 hours in an atmosphere containing 3 to 100% of hydrogen may be employed.

Subsequently, a second interlayer insulating film 5037 is formed over the first interlayer insulating film 5036. An inorganic insulating film may be used as the second interlayer insulating film 5037. For example, a silicon oxide film formed by CVD, a silicon oxide film coated by SOG (Spin On Glass), or the like may be used. In addition, as the second interlayer insulating film 5037, an organic insulating film may be used. For example, a film made of polyimide, polyamide, BCB (benzocyclobutene), acrylic, or the like may be used. Alternatively, a laminated structure of an acrylic film and a silicon oxynitride film can also be used. Also, a laminated structure of an acryl film and a silicon nitride film or a silicon nitride oxide film formed by sputtering may be used. In this embodiment, an acrylic film in thickness of 1.6 μm is formed. The second interlayer insulating film 5037 can reduce unevenness due to the TFTs formed over the substrate 201 and provide levelness. In particular, the second interlayer insulating film 5037 is provided mainly for attaining levelness, and thus is preferably a film that is excellent in levelness.

Next, the second interlayer insulating film 5037, the first interlayer insulating film 5036, and a gate insulating film 203 are etched by using dry etching or wet etching, thereby forming contact holes that reach each source region and drain region of the N-channel type TFTs 361 and 362, the P-channel type TFT 363, the N-channel type TFT 364 and the P-channel type TFT 365.

Subsequently, a pixel electrode 5038 consisted of a transparent conductive film is formed. For a transparent conductive film, a compound of indium oxide and tin oxide (ITO), a compound of indium oxide and tin oxide added with silicon oxide (ITSO) a compound of indium oxide and zinc oxide, zinc oxide, tin oxide, indium oxide or the like can be used. Alternatively, the matter that gallium is added to the foregoing transparent conductive film may be used. The pixel electrode 5038 corresponds to an anode of a light emitting element. In this embodiment, ITSO is formed in a thickness of 110 nm, and the patterning is carried out to form the pixel electrode 5038.

Subsequently, wirings 5039 to 5046 which are electrically connected to the source region and drain region of each TFT respectively (the N-channel type TFTs 361 and 362, the P-channel type TFT 363, the N-channel type TFT 364 and the P-channel type TFT 365) are formed. It is to be noted that in this embodiment, the wirings 5039 to 5046 are formed by forming a laminate film of a Ti film in a thickness of 100 nm, an Al film in a thickness of 350 nm and a Ti film in a thickness of 100 nm continuously by sputtering, and patterning the laminate film in a desired shape. Needless to say, the invention is not limited to a three-layer structure, but a monolayer structure or a two-layer structure or a laminated structure of four or more layers may be adopted. Further, the materials for wirings are not limited to Al and Ti, and another conductive film may be used. For example, the wirings may be formed by patterning a laminate film in which an Al film or a Cu film is formed on a TaN film and a Ti film is further formed thereon. In this way, one of the source region or the drain region of the N-channel type TFT 361 of the pixel portion is electrically connected to the pixel electrode 5038 via the wiring 5039. Here, the electrical connection is made between the wiring 5039 and the pixel electrode 5038 by superimposing a portion on the pixel electrode 5038 and a portion of the wiring 5039.

Subsequently, as shown in FIG. 8D, a third interlayer insulating film 5047 is formed. As for the third interlayer insulating film 5047, inorganic and organic insulating films may be used. As an inorganic insulating film, a silicon oxide film formed by a CVD method and a silicon oxide film coated by SOG (Spin On Glass), a silicon nitride film or a silicon oxynitride film formed by sputtering or the like can be used. Moreover, as an organic insulating film, an acrylic resin film or the like can be used. Besides, an organic siloxane-based insulating film having siloxane bond and having attached organic groups such as methyl and phenyl on the silicon.

An opening portion is formed at the position corresponding to the pixel electrode 5038 of the third interlayer insulating film 5047. The third interlayer insulating film 5047 functions as a bank. At the time when the opening portion is formed, the sidewall can be easily made in a tapered shape by employing wet etching. Since the deterioration of an organic compound layer caused by the difference of steps becomes a significant problem when the sidewall of the opening portion is not sufficiently gentle, a considerable care is required.

Subsequently, a thermal treatment is conducted under reduced pressure at the temperature ranging from 150 to 450° C., more preferably at 250 to 350° C. in order to dehydrogenate the third interlayer insulating film 5047. After that, an organic compound layer 5048 is formed on the pixel electrode 5038 which is exposed in the opening portion on the third interlayer insulating film 5047. A known organic light emitting material can be used as the organic compound layer 5048. Note that both of an organic light emitting material and an inorganic light emitting material may be used, or an inorganic light emitting material may be used instead of an organic light emitting material.

As an organic light emitting material, a low molecular weight organic light emitting material, a high molecular weight organic light emitting material and a medium molecular weight organic light-emitting material can be freely used. It should be noted that the medium molecular weight organic light emitting material is defined as an organic light emitting material which does not have the sublimation property and whose degree of polymerization is about 20 or less.

In this embodiment, the organic compound layer 5048 is formed using a low molecular weight organic light emitting material by vapor deposition. Specifically, it is formed in a laminated structure in which a copper phthalocyanine (CuPc) film in a thickness of 20 nm has been provided as a hole injection layer, and a tris-8-quinolinolatoaluminium complex ($Alq_3$) film in a thickness of 70 nm is provided thereover as a light emitting layer. The light emitting color can be controlled by adding the fluorescent pigment such as quinacridone, perylene and DCM1 to $Alq_3$.

Moreover, as an example of using a high molecular weight organic light emitting material, the organic compound layer 5048 may be formed to have a laminated structure in which a polythiophene (PEDOT) film in a thickness of 20 nm is provided as a hole injection layer by spin coating, and a paraphenylene vinylene (PPV) film in a thickness of about 100 nm is formed thereover as a light emitting layer. It should be noted that when p conjugated high molecular PPV is used, the light emitting wavelengths from red color to blue color can be selected. Moreover, an inorganic material such as silicon carbide can be used for the electron transporting layer and the electron injection layer.

It should be noted that the organic compound layer 5048 is not limited to an organic compound layer having the laminated structure in which a hole injection layer, a hole transporting layer, a light emitting layer, an electron transporting layer, and an electron injection layer or the like are clearly discriminated. That is, the organic compound layer 5048 may be of a structure having a mixed layer of materials constituting the hole injection layer, the hole transporting layer, the light emitting layer, the electron transporting layer, and the electron injection layer and the like. For example, it may be the organic compound layer 5048 having a structure in which a mixed layer consisted of a material constituting the electron transporting layer (hereinafter described as an electron transporting material) and a material constituting the light emitting layer (hereinafter described as a light emitting material) is formed between the electron transporting layer and the light emitting layer.

Subsequently, a counter electrode 5049 formed of a conductive film is provided on the organic compound layer 5048. In the case of this embodiment, an alloy film of aluminum and lithium is used as the conductive film. It is to be noted that a Mg—Ag film (an alloy film of magnesium and silver) may be used. In this embodiment, the counter electrode 5049 corresponds to a cathode of a light emitting element. As a cathode material, a conductive film consisted of an element belonging to 1 group or 2 group of the periodic table or a conductive film to which these elements are added can be freely used.

An light emitting element is completed at the time when the counter electrode 5049 is formed. It is to be noted that the light emitting element means a diode formed of the pixel electrode (anode) 5038, the organic compound layer 5048 and the counter electrode (cathode) 5049.

It is effective to provide a passivation film 5050 so as to completely cover the light emitting element. As the passivation film 5050, an insulating film including a carbon film, a silicon nitride film or a silicon oxynitride film can be used with a monolayer or a laminated layer. It is preferable that a film excellent in coverage is used as the passivation film 5050, and it is effective that a carbon film, particularly DLC (diamond-like carbon) film is used. Since the DLC film can be formed as a film at a temperature in the range from room temperature to 100° C. or less, it can be easily formed as a film even at the upper portion of the organic compound layer 5048 whose heat resistance is low. Moreover, as the DLC film has a high blocking effect against oxygen, the oxidation of the organic compound layer 5048 can be suppressed.

It should be noted that after the third interlayer insulating film 5047 is formed, it is effective to continuously conduct the steps up to the step of forming the passivation film 5050 without exposing it to the outside air using a film formation apparatus of a multi-chamber method (or in-line method).

It is to be noted that actually, when the state of FIG. 8D is completed, it is preferable that it is packaged with a protection film whose sealing property is high and degas is slight (laminated film, ultraviolet curing resin film or the like) or with a sealing member having the translucency so that it is not exposed to the outside air. At that time, when an inactive atmosphere is inputted into the internal portion of the sealing member, or a moisture absorption material (for example, barium oxide) is disposed internally, the reliability of the light emitting element is enhanced.

Moreover, when the sealing property is enhanced by performing the treatment such as packaging or the like, it is completed as a product by mounting a connector (flexible printed circuit: FPC) for connecting a terminal led out from an element or a circuit formed over the substrate 201 and an external signal terminal.

This embodiment can be implemented freely in combination with Embodiment Mode and Embodiments 1 and 2.

Embodiment 5

Figure 9:
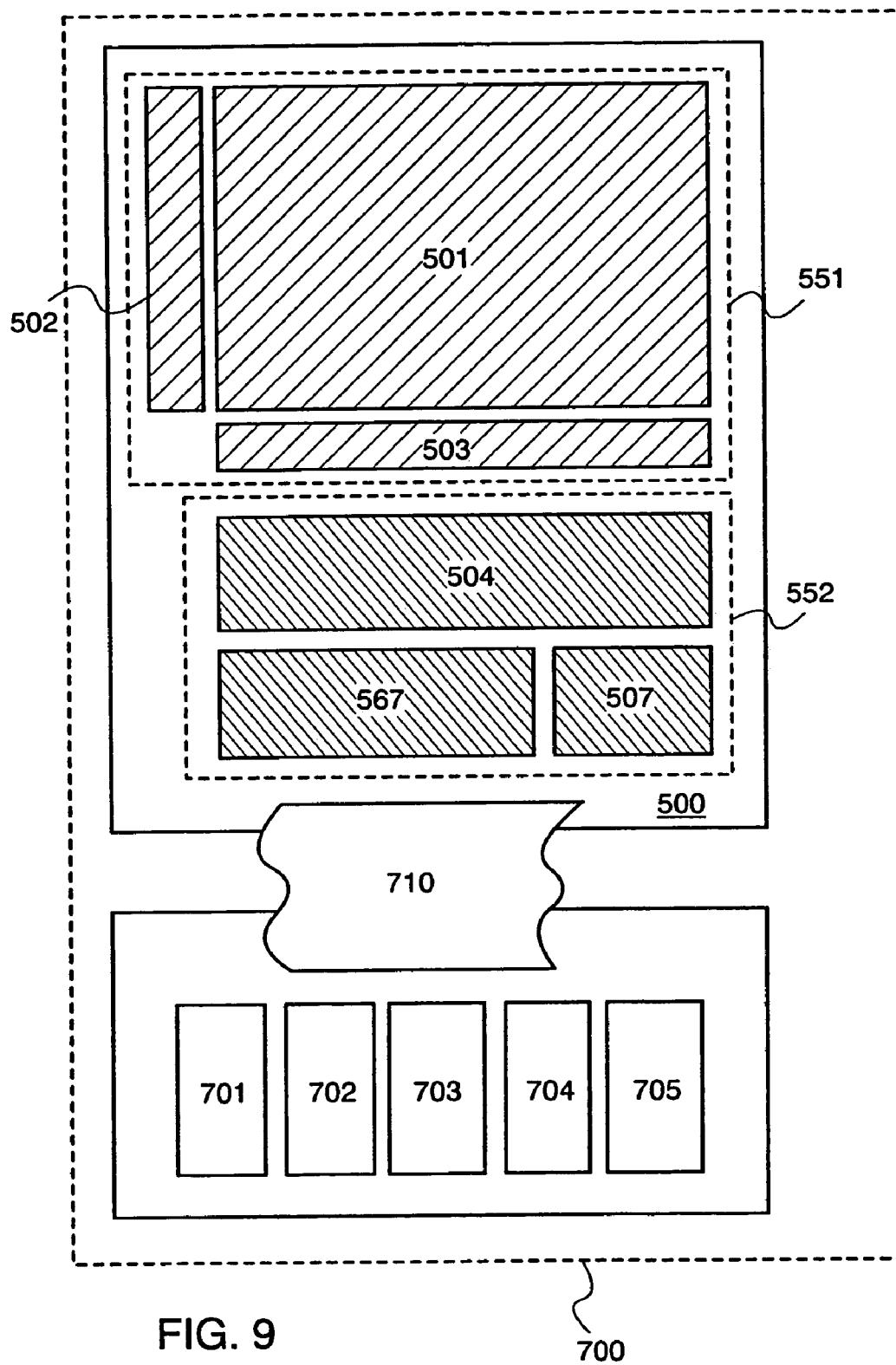
FIG. 9 is a diagram showing a display system using a display device of the invention.

In this embodiment, an example of a display system fabricated by using the invention will be described with reference to FIG. 9.

Here, a display system includes a substrate over which a display device and a CPU portion are formed, and a circuit externally attached by FPC or the like. As a method of fabricating the display device, those of Embodiments 1 to 3 are used. The configuration example of a display system is shown in FIG. 9.

A circuit having a configuration as shown in FIGS. 4 and 5 is formed over a substrate 500. Here, an example using a circuit having a configuration shown in FIG. 5 is shown. In a display system 700, the substrate 500 is electrically connected to a power supply circuit 701, a clock oscillation circuit 702, a VRAM 703, a ROM 704 and a WRAM 705 via an FPC 710. Here, the power source circuit 701 is a circuit for converting the power source provided into the display system 700 into a power source for the circuit formed on the substrate 500. The clock oscillation circuit 702 is a circuit for inputting a control signal such as a clock signal into a circuit formed on the substrate 500. The VRAM 703 is a circuit for storing a video signal in a form to be inputted into a GPU 567. The ROM 704 is a circuit for storing data for controlling the CPU 507 and video signal inputted to the display system 700. The WRAM 705 is a work region in which the CPU 507 performs processing.

It should be noted that since both of the SRAM 504 provided on the substrate 500 and the WRAM 705 connected via the FPC 710 function as the work region of the CPU 507, either one of them can be omitted. For example, in the case where accesses from the CPU 507 are many, but only relatively small memory capacity is required, it is preferable to use the SRAM 504. On the contrary, in the case where large memory capacity is required but the accesses from the CPU 507 are relatively few, it is preferable to use the WRAM 705.

Embodiment 6

In this embodiment, examples of electronic apparatuses manufactured by using the invention will be described with reference to FIGS. 10A to 10G.

Examples of the electric apparatuses employing the present invention include a video camera, a digital camera, a goggle type display (head mounted display), a navigation system, an audio reproducing apparatus (such as car audio system and audio component system), a laptop computer, a game machine, a portable information terminal (such as mobile computer, mobile telephone, portable game machine, and electronic book) and an image reproducing apparatus provided with a recording medium (specifically, an apparatus which reproduces a recording medium such as a digital versatile disc (DVD) and provided with a display capable of displaying an image thereof). FIGS. 10A to 10G show specific examples thereof.

Figure 10A:
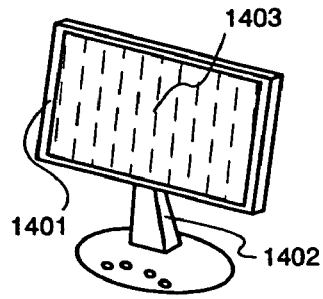
FIGS. 10A to 10G are views of electronic apparatuses using a semiconductor device and a display device of the invention.

FIG. 10A illustrates a display device including a housing 1401, a support base 1402, and a display portion 1403. The invention can be applied to the display device, which constitutes the display portion 1403. A small, lightweight and high functional display device can be realized by utilizing the invention.

Figure 10B:
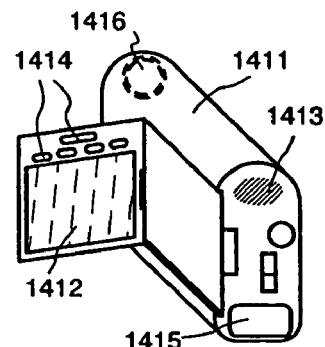

FIG. 10B illustrates a video camera including a main body 1411, a display portion 1412, an audio input portion 1413, operating switches 1414, a battery 1415, an image receiving portion 1416 and the like. The invention can be applied to the display device which constitutes the display portion 1412. A small, lightweight and high functional video camera can be realized by utilizing the invention.

Figure 10C:
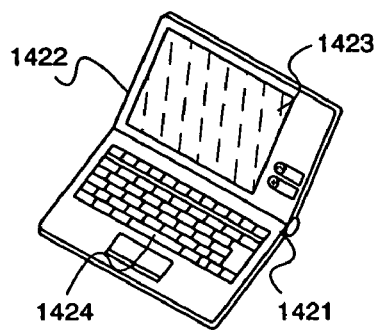

FIG. 10C illustrates a laptop personal computer including a main body 1421, a housing 1422, a display portion 1423, a keyboard 1424 and the like. The invention can be applied to the display device which constitutes the display portion 1423. Also, the invention can be applied to a semiconductor device such as a CPU and a memory in the main body 1421. A small, lightweight and high functional personal computer can be realized by utilizing the invention.

Figure 10D:
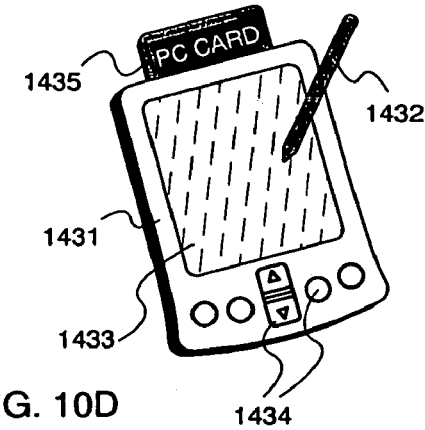

FIG. 10D illustrates a portable information terminal including a main body 1431, a stylus 1432, a display portion 1433, operating buttons 1434, an external interface 1435 and the like. The invention can be applied to the display device which constitutes the display portion 1433. Also, the invention can be applied to a semiconductor device such as a CPU and a memory in the main body 1431. A small, lightweight and high functional portable information terminal can be realized by utilizing the invention.

Figure 10E:
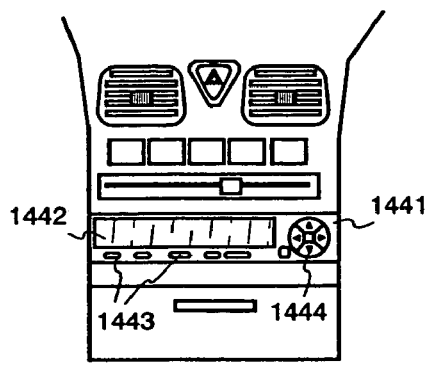

FIG. 10E illustrates an audio reproducing device, specifically a car audio system, including a main body 1441, a display portion 1442, operating switches 1443 and 1444 and the like. The invention can be applied to the display device which constitutes the display portion 1442. Also, the invention can be applied to a semiconductor device such as a CPU and a memory in the main body 1441. Further, although the a car audio system is illustrated in this example, the invention may also be used for a potable or home audio system. A small, lightweight and high functional audio reproducing device can be realized by utilizing the invention.

Figure 10F:
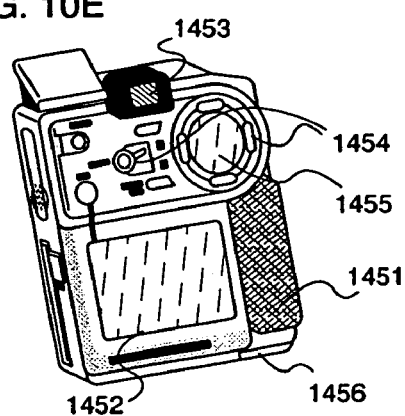

FIG. 10F illustrates a digital camera including a main body 1451, a display portion (A) 1452, an eyepiece portion 1453, operating switches 1454, a display portion (B) 1455, a battery 1456 and the like. The invention can be applied to the display device which constitutes the display portion (A) 1452 and the display portion (B) 1455. Also, the invention can be applied to a semiconductor device such as a CPU and a memory in the main body 1451. A small, lightweight and high functional digital camera can be realized by utilizing the invention.

Figure 10G:
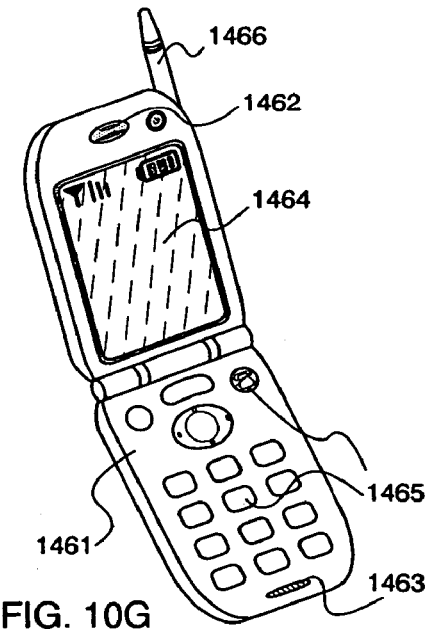

FIG. 10G illustrates a portable telephone including a main body 1461, an audio output portion 1462, an audio input portion 1463, a display portion 1464, operating switches 1465, an antenna 1466 and the like. The invention can be applied to the display device which constitutes the display portion 1464. Also, the invention can be applied to a semiconductor device such as a CPU and a memory in the main body 1461. A small, lightweight and high functional portable telephone can be realized by utilizing the invention.

Not only a glass substrate but also a heat-resistant plastic substrate can be used for the semiconductor device and the display device used in each of the above electronic apparatuses. Thus, further reduction in weight can be realized.

The invention is not limited to the aforementioned electronic apparatuses but can also include various electronic apparatuses using the semiconductor device and the display device as shown in Embodiment Mode.

This application is based on Japanese Patent Application serial no. 2003-373775 filed in Japan Patent Office on Oct. 31, 2003, the contents of which are hereby incorporated by reference.

Although the present invention has been fully described by way of example with reference to the accompanying drawings, it is to be understood that various changes and modifications will be apparent to those skilled in the art. Therefore, unless such changes and modifications depart from the scope of the present invention, they should be construed as being included therein.

What is claimed is:

1. A semiconductor device comprising a functional circuit comprising a standard cell comprising:
   an input side logic circuit; and
   an output side logic circuit,
   wherein each of the input side logic circuit and the output side logic circuit comprises a circuit comprising any one of a gate circuit and a sequential circuit,
   wherein an input capacitance of the input side logic circuit is smaller than an input capacitance of the output side logic circuit, and
   wherein a driving capacity of the output side logic circuit is larger than a driving capacity of the input side logic circuit.

2. A semiconductor device comprising a functional circuit comprising a standard cell comprising:
   an input side logic circuit; and
   an output side logic circuit,
   wherein each of the input side logic circuit and the output side logic circuit comprises a plurality of circuits comprising any one of a gate circuit and a sequential circuit,
   wherein an input capacitance of the input side logic circuit is smaller than an input capacitance of the output side logic circuit, and
   wherein a driving capacity of the output side logic circuit is larger than a driving capacity of the input side logic circuit.

3. A semiconductor device comprising a functional circuit comprising a plurality of standard cells comprising:
   an input side logic circuit; and
   an output side logic circuit,
   wherein each of the input side logic circuit and the output side logic circuit comprises a circuit comprising any one of a gate circuit and a sequential circuit,
   wherein an input capacitance of the input side logic circuit is smaller than an input capacitance of the output side logic circuit, and
   wherein a driving capacity of the output side logic circuit is larger than a driving capacity of the input side logic circuit.

4. A semiconductor device comprising a functional circuit comprising a plurality of standard cells comprising:
   an input side logic circuit; and
   an output side logic circuit,
   wherein each of the input side logic circuit and the output side logic circuit comprises a plurality of circuits comprising any one of a gate circuit and a sequential circuit,
   wherein an input capacitance of the input side logic circuit is smaller than an input capacitance of the output side logic circuit, and
   wherein a driving capacity of the output side logic circuit is larger than a driving capacity of the input side logic circuit.

5. The semiconductor device according claim 1,
   wherein the gate circuit is any one of a negation gate circuit, disjunction gate circuit, conjunction gate circuit, non-disjunction gate circuit, non-conjunction gate circuit, exclusive disjunction gate circuit, and exclusive non-disjunction gate circuit.

6. The semiconductor device according to claim 1,
   wherein the sequential circuit is either a flip-flop circuit or a latch circuit.

7. The semiconductor device according to claim 1,
   wherein the input side logic circuit comprising a thin film transistor of which channel width is 10 μm or less.

8. The semiconductor device according to claim 1,
   wherein the output side logic circuit comprising a thin film transistor of which channel width is 5 μm or more.

9. The semiconductor device according to claim 1,
   wherein the functional circuit comprising at least one of a central processing unit, a memory device, a static memory, a dynamic memory, and a non-volatile memory.

10. The semiconductor device according to claim 1,
    wherein any one of the gate circuit and the sequential circuit comprises a thin film transistor.

11. The semiconductor device according to claim 1,
    wherein the semiconductor device is used in one selected from the group consisting of a video camera, a digital camera, a goggle type display, a navigation system, an audio reproducing apparatus, a laptop computer, a game machine, a portable information terminal and an image reproducing apparatus provided with a recording medium.

12. The semiconductor device according claim 2,
    wherein the gate circuit is any one of a negation gate circuit, disjunction gate circuit, conjunction gate circuit, non-disjunction gate circuit, non-conjunction gate circuit, exclusive disjunction gate circuit, and exclusive non-disjunction gate circuit.

13. The semiconductor device according to claim 2,
wherein the sequential circuit is either a flip-flop circuit or a latch circuit.

14. The semiconductor device according to claim 2,
wherein the input side logic circuit comprising a thin film transistor of which channel width is 10 µm or less.

15. The semiconductor device according to claim 2,
wherein the output side logic circuit comprising a thin film transistor of which channel width is 5 µm or more.

16. The semiconductor device according to claim 2,
wherein the functional circuit comprising at least one of a central processing unit, a memory device, a static memory, a dynamic memory, and a non-volatile memory.

17. The semiconductor device according to claim 2,
wherein any one of the gate circuit and the sequential circuit comprises a thin film transistor.

18. The semiconductor device according to claim 2,
wherein the semiconductor device is used in one selected from the group consisting of a video camera, a digital camera, a goggle type display, a navigation system, an audio reproducing apparatus, a laptop computer, a game machine, a portable information terminal and an image reproducing apparatus provided with a recording medium.

19. The semiconductor device according claim 3,
wherein the gate circuit is any one of a negation gate circuit, disjunction gate circuit, conjunction gate circuit, non-disjunction gate circuit, non-conjunction gate circuit, exclusive disjunction gate circuit, and exclusive non-disjunction gate circuit.

20. The semiconductor device according to claim 3,
wherein the sequential circuit is either a flip-flop circuit or a latch circuit.

21. The semiconductor device according to claim 3,
wherein the input side logic circuit comprising a thin film transistor of which channel width is 10 µm or less.

22. The semiconductor device according to claim 3,
wherein the output side logic circuit comprising a thin film transistor of which channel width is 5 µm or more.

23. The semiconductor device according to claim 3,
wherein the functional circuit comprising at least one of a central processing unit, a memory device, a static memory, a dynamic memory, and a non-volatile memory.

24. The semiconductor device according to claim 3,
wherein any one of the gate circuit and the sequential circuit comprises a thin film transistor.

25. The semiconductor device according to claim 3,
wherein the semiconductor device is used in one selected from the group consisting of a video camera, a digital camera, a goggle type display, a navigation system, an audio reproducing apparatus, a laptop computer, a game machine, a portable information tenninal and an image reproducing apparatus provided with a recording medium.

26. The semiconductor device according claim 4,
wherein the gate circuit is any one of a negation gate circuit, disjunction gate circuit, conjunction gate circuit, non-disjunction gate circuit, non-conjunction gate circuit, exclusive disjunction gate circuit, and exclusive non-disjunction gate circuit.

27. The semiconductor device according to claim 4,
wherein the sequential circuit is either a flip-flop circuit or a latch circuit.

28. The semiconductor device according to claim 4,
wherein the input side logic circuit comprising a thin film transistor of which channel width is 10 µm or less.

29. The semiconductor device according to claim 4,
wherein the output side logic circuit comprising a thin film transistor of which channel width is 5 µm or more.

30. The semiconductor device according to claim 4,
wherein the functional circuit comprising at least one of a central processing unit, a memory device, a static memory, a dynamic memory, and a non-volatile memory.

31. The semiconductor device according to claim 4,
wherein any one of the gate circuit and the sequential circuit comprises a thin film transistor.

32. The semiconductor device according to claim 4,
wherein the semiconductor device is used in one selected from the group consisting of a video camera, a digital camera, a goggle type display, a navigation system, an audio reproducing apparatus, a laptop computer, a game machine, a portable information terminal and an image reproducing apparatus provided with a recording medium.

33. A display device comprising a functional circuit comprising a standard cell comprising:
an input side logic circuit; and
an output side logic circuit,
wherein each of the input side logic circuit and the output side logic circuit comprises a circuit comprising any one of a gate circuit and a sequential circuit,
wherein an input capacitance of the input side logic circuit is smaller than an input capacitance of the output side logic circuit, and
wherein a driving capacity of the output side logic circuit is larger than a driving capacity of the input side logic circuit.

34. A display device comprising a functional circuit comprising a standard cell comprising:
an input side logic circuit; and
an output side logic circuit,
wherein each of the input side logic circuit and the output side logic circuit comprises a plurality of circuits comprising any one of a gate circuit and a sequential circuit,
wherein an input capacitance of the input side logic circuit is smaller than an input capacitance of the output side logic circuit, and
wherein a driving capacity of the output side logic circuit is larger than a driving capacity of the input side logic circuit.

35. A display device comprising a functional circuit comprising a plurality of standard cells comprising:
an input side logic circuit; and
an output side logic circuit,
wherein each of the input side logic circuit and the output side logic circuit comprises a circuit comprising any one of a gate circuit and a sequential circuit,
wherein an input capacitance of the input side logic circuit is smaller than an input capacitance of the output side logic circuit, and
wherein a. driving capacity of the output side logic circuit is larger than a driving capacity of the input side logic circuit.

36. A display device comprising a functional circuit comprising a plurality of standard cells comprising:
an input side logic circuit; and
an output side logic circuit, wherein each of the input side logic circuit and the output side logic circuit comprises a plurality of circuits comprising any one of a gate circuit and a sequential circuit, wherein an input capacitance of the input side logic circuit is smaller than an input capacitance of the output side logic circuit, and wherein a driving capacity of the output side logic circuit is larger than a driving capacity of the input side logic circuit.

37. The display device according claim 33, wherein the gate circuit is any one of a negation gate circuit, disjunction gate circuit, conjunction gate circuit, non-disjunction gate circuit, non-conjunction gate circuit, exclusive disjunction gate circuit, and exclusive non-disjunction gate circuit.

38. The display device according to claim 33, wherein the sequential circuit is either a flip-flop circuit or a latch circuit.

39. The display device according to claim 33, wherein the input side logic circuit comprising a thin film transistor of which channel width is 10 μm or less.

40. The display device according to claim 33, wherein the output side logic circuit comprising a thin film transistor of which channel width is 5 μm or more.

41. The display device according to claim 33, wherein the functional circuit comprising at least one of a central processing unit, a memory device, a static memory, a dynamic memory, and a non-volatile memory.

42. The display device according to claim 33, wherein any one of the gate circuit and the sequential circuit comprises a thin film transistor.

43. The display device according to claim 33, wherein the display device is used in one selected from the group consisting of a video camera, a digital camera, a goggle type display, a navigation system, an audio reproducing apparatus, a laptop computer, a game machine, a portable information terminal and an image reproducing apparatus provided with a recording medium.

44. The display device according claim 34, wherein the gate circuit is any one of a negation gate circuit, disjunction gate circuit, conjunction gate circuit, non-disjunction gate circuit, non-conjunction gate circuit, exclusive disjunction gate circuit, and exclusive non-disjunction gate circuit.

45. The display device according to claim 34, wherein the sequential circuit is either a flip-flop circuit or a latch circuit.

46. The display device according to claim 34, wherein the input side logic circuit comprising a thin film transistor of which channel width is 10 μm or less.

47. The display device according to claim 34, wherein the output side logic circuit comprising a thin film transistor of which channel width is 5 μm or more.

48. The display device according to claim 34, wherein the functional circuit comprising at least one of a central processing unit, a memory device, a static memory, a dynamic memory, and a non-volatile memory.

49. The display device according to claim 34, wherein any one of the gate circuit and the sequential circuit comprises a thin film transistor.

50. The display device according to claim 34, wherein the display device is used in one selected from the group consisting of a video camera, a digital camera, a goggle type display, a navigation system, an audio reproducing apparatus, a laptop computer, a game machine, a portable information terminal and an image reproducing apparatus provided with a recording medium.

51. The display device according claim 34, wherein the gate circuit is any one of a negation gate circuit, disjunction gate circuit, conjunction gate circuit, non-disjunction gate circuit, non-conjunction gate circuit, exclusive disjunction gate circuit, and exclusive non-disjunction gate circuit.

52. The display device according to claim 35, wherein the sequential circuit is either a flip-flop circuit or a latch circuit.

53. The display device according to claim 35, wherein the input side logic circuit comprising a thin film transistor of which channel width is 10 μm or less.

54. The display device according to claim 35, wherein the output side logic circuit comprising a thin film transistor of which channel width is 5 μm or more.

55. The display device according to claim 35, wherein the functional circuit comprising at least one of a central processing unit, a memory device, a static memory, a dynamic memory, and a non-volatile memory.

56. The display device according to claim 35, wherein any one of the gate circuit and the sequential circuit comprises a thin film transistor.

57. The display device according to claim 35, wherein the display device is used in one selected from the group consisting of a video camera, a digital camera, a goggle type display, a navigation system, an audio reproducing apparatus, a laptop computer, a game machine, a portable information terminal and an image reproducing apparatus provided with a recording medium.

58. The display device according claim 36, wherein the gate circuit is any one of a negation gate circuit, disjunction gate circuit, conjunction gate circuit, non-disjunction gate circuit, non-conjunction gate circuit, exclusive disjunction gate circuit, and exclusive non-disjunction gate circuit.

59. The display device according to claim 36, wherein the sequential circuit is either a flip-flop circuit or a latch circuit.

60. The display device according to claim 36, wherein the input side logic circuit comprising a thin film transistor of which channel width is 10 μm or less.

61. The display device according to claim 36, wherein the output side logic circuit comprising a thin film transistor of which channel width is 5 μm or more.

62. The display device according to claim 36, wherein the functional circuit comprising at least one of a central processing unit, a memory device, a static memory, a dynamic memory, and a non-volatile memory.

63. The display device according to claim 36, wherein any one of the gate circuit and the sequential circuit comprises a thin film transistor.

64. The display device according to claim 36, wherein the display device is used in one selected from the group consisting of a video camera, a digital camera, a goggle type display, a navigation system, an audio reproducing apparatus, a laptop computer, a game machine, a portable information terminal and an image reproducing apparatus provided with a recording medium.

\* \* \* \* \*